US012538654B2

(12) United States Patent
Kim et al.

(10) Patent No.: US 12,538,654 B2
(45) Date of Patent: Jan. 27, 2026

(54) DISPLAY DEVICE HAVING GATE INSULATING LAYER INCLUDING FIRST INSULATING LAYER, SECOND INSULATING LAYER, AND THIRD INSULATING LAYER, AND ELECTRONIC APPARATUS INCLUDING THE SAME

(71) Applicant: Samsung Display Co., LTD., Yongin-si (KR)

(72) Inventors: Keunwoo Kim, Seongnam-si (KR); Taewook Kang, Seongnam-si (KR); Joon Woo Bae, Hwaseong-si (KR); Yu-Gwang Jeong, Anyang-si (KR); Sungwon Cho, Hwaseong-si (KR); Jaehwan Chu, Hwaseong-si (KR); Sanggun Choi, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 628 days.

(21) Appl. No.: 17/900,625

(22) Filed: Aug. 31, 2022

(65) Prior Publication Data
US 2023/0075763 A1 Mar. 9, 2023

(30) Foreign Application Priority Data
Sep. 9, 2021 (KR) .......................... 10-2021-0120239

(51) Int. Cl.
*H01L 29/08* (2006.01)
*G09G 3/20* (2006.01)
(Continued)

(52) U.S. Cl.
CPC ....... *H10K 59/1213* (2023.02); *G09G 3/2096* (2013.01); *G09G 3/3233* (2013.01);
(Continued)

(58) Field of Classification Search
CPC .......... H10K 59/1213; H10K 59/1216; H10K 59/124; H10K 59/1201
(Continued)

(56) References Cited

U.S. PATENT DOCUMENTS

2015/0076471 A1 3/2015 Saito et al.
2017/0373094 A1* 12/2017 Park ................... H10D 86/0231
(Continued)

FOREIGN PATENT DOCUMENTS

CN 113363290 A 9/2021
KR 10-0579188 5/2006
(Continued)

OTHER PUBLICATIONS

Cite the machine translation Murashige S (WOO-2018199037-A1).*
(Continued)

*Primary Examiner* — Phuc T Dang
(74) *Attorney, Agent, or Firm* — Womble Bond Dickinson (US) LLP

(57) ABSTRACT

A display device includes: a substrate; and a plurality of pixel circuits on the substrate comprising: an active layer including a first region and a second region; a gate insulating layer on the active layer, the gate insulating layer including a first insulating layer overlapping the first region and the second region, a second insulating layer on the first insulating layer and overlapping the first region, and a third insulating layer on the second insulating layer and overlapping the first region and the second region; and a first conductive layer on the gate insulating layer, the first conductive layer including a first gate electrode overlapping the first region to form a driving transistor, and a second gate electrode overlapping the second region to form a switching transistor.

20 Claims, 33 Drawing Sheets

(51) Int. Cl.
　　　*G09G 3/3233*　　(2016.01)
　　　*H10K 59/121*　　(2023.01)
　　　*H10K 59/124*　　(2023.01)
　　　*H10K 71/00*　　(2023.01)
　　　*H10K 59/12*　　(2023.01)

(52) U.S. Cl.
　　　CPC ....... *H10K 59/1216* (2023.02); *H10K 59/124* (2023.02); *H10K 71/00* (2023.02); *G09G 2300/0819* (2013.01); *G09G 2300/0842* (2013.01); *H10K 59/1201* (2023.02)

(58) Field of Classification Search
　　　USPC .......................................................... 257/40
　　　See application file for complete search history.

(56) References Cited

U.S. PATENT DOCUMENTS

| | | |
|---|---|---|
| 2021/0066351 A1 | 3/2021 | Watakabe et al. |
| 2021/0104558 A1 | 4/2021 | Kim et al. |
| 2021/0111197 A1 | 4/2021 | Moon et al. |
| 2021/0280652 A1 | 9/2021 | Kim et al. |

FOREIGN PATENT DOCUMENTS

| | | | | |
|---|---|---|---|---|
| KR | 10-2021-0004794 | | 1/2021 | |
| KR | 10-2021-0113513 | | 9/2021 | |
| WO | WO-2011043183 A1 | * | 4/2011 | ........... G02F 1/1362 |
| WO | WO-2018199037 A1 | * | 11/2018 | |

OTHER PUBLICATIONS

Cite the machine translation Matsukizono H (WO-2011043183).*
EPO Extended European Search Report dated Mar. 6, 2023, issued in corresponding European Patent Application No. 22189622.8 (9 pages).

* cited by examiner

DISPLAY DEVICE HAVING GATE INSULATING LAYER INCLUDING FIRST INSULATING LAYER, SECOND INSULATING LAYER, AND THIRD INSULATING LAYER, AND ELECTRONIC APPARATUS INCLUDING THE SAME

CROSS-REFERENCE TO RELATED APPLICATION

The present application claims priority to and the benefit of Korean Patent Application No. 10-2021-0120239 filed on Sep. 9, 2021 in the Korean Intellectual Property Office (KIPO), the entire disclosure of which is incorporated herein by reference.

BACKGROUND

1. Field

Aspects of some embodiments of the present disclosure relate to a display device.

2. Description of the Related Art

A display device may include a plurality of pixels that display colors. Each of the pixels may include a light emitting element, a driving transistor, and at least one switching transistor. The light emitting element may emit light for expressing color, and the driving transistor may provide a driving current to the light emitting element. The switching transistor may be electrically connected to the driving transistor.

In order for pixels in a display device to more stably express color, it may be desirable for a leakage current of the switching transistors to be relatively small. Further, in order for the pixel to express more diverse colors, it may be desirable for a driving range of the driving transistors to be relatively large.

The above information disclosed in this Background section is only for enhancement of understanding of the background and therefore the information discussed in this Background section does not necessarily constitute prior art.

SUMMARY

Aspects of some embodiments of the present disclosure relate to a display device. For example, aspects of some embodiments relate to a display device applied to various electronic apparatuses and a method of manufacturing the display device.

Aspects of some embodiments of the present disclosure include a display device, a method of manufacturing the display device, and an electronic apparatus including the display device for decreasing a leakage current of a switching transistor and increasing a driving range of a driving transistor.

A display device according to some embodiments includes: a substrate; and a plurality of pixel circuits on the substrate. At least one pixel circuit of the pixel circuits may include an active layer including a first region and a second region; a gate insulating layer on the active layer, the gate insulating layer including a first insulating layer overlapping the first region and the second region, a second insulating layer on the first insulating layer and overlapping the first region, and a third insulating layer on the second insulating layer and overlapping the first region and the second region; and a first conductive layer on the gate insulating layer, the first conductive layer including a first gate electrode overlapping the first region to form a driving transistor, and a second gate electrode overlapping the second region to form a switching transistor. A thickness of a first portion of the gate insulating layer overlapping the first region may be greater than a thickness of a second portion of the gate insulating layer overlapping the second region.

According to some embodiments, an equivalent oxide thickness of the first portion of the gate insulating layer may be greater than an equivalent oxide thickness of the second portion of the gate insulating layer.

According to some embodiments, a hydrogen concentration of the second region of the active layer may be greater than a hydrogen concentration of the first region of the active layer.

According to some embodiments, the first insulating layer may include silicon oxide.

According to some embodiments, the third insulating layer may include silicon nitride.

According to some embodiments, the second insulating layer may include silicon nitride.

According to some embodiments, a hydrogen concentration of the second insulating layer may be substantially equal to a hydrogen concentration of the third insulating layer.

According to some embodiments, a hydrogen concentration of the second insulating layer may be less than a hydrogen concentration of the third insulating layer.

According to some embodiments, a value [N—H]/[Si—H] (a ratio of a nitrogen-hydrogen bond concentration to a silicon-hydrogen bond concentration) of the second insulating layer may be in a range from about 14 to about 30.

According to some embodiments, the second insulating layer may include silicon oxynitride.

According to some embodiments, an atomic percentage of nitrogen in the second insulating layer may be in a range from about 10% to about 50%.

According to some embodiments, the at least one pixel circuit may further include an insulating interlayer on the first conductive layer; and a second conductive layer on the insulating interlayer, the second conductive layer including a capacitor electrode overlapping the first gate electrode to form a storage capacitor.

According to some embodiments, the second region of the active layer may be electrically connected to the first gate electrode.

According to some embodiments, the second region of the active layer may be electrically connected to the capacitor electrode.

A display device according to some embodiments includes a substrate; and a plurality of pixel circuits on the substrate. At least one pixel circuit of the pixel circuits may include an active layer including a first region having a first hydrogen concentration and a second region having a second hydrogen concentration greater than the first hydrogen concentration; a gate insulating layer on the active layer, the gate insulating layer including a first insulating layer overlapping the first region and the second region, and a second insulating layer on the first insulating layer and overlapping the first region; and a first conductive layer
    on the gate insulating layer, the first conductive layer
        including a first gate electrode overlapping the first
        region to form a driving transistor, and a second gate
        electrode overlapping the second region to form a
        switching transistor.

According to some embodiments, a thickness of a first portion of the gate insulating layer overlapping the first region may be greater than a thickness of a second portion of the gate insulating layer overlapping the second region.

According to some embodiments, an equivalent oxide thickness of the first portion of the gate insulating layer may be greater than an equivalent oxide thickness of the second portion of the gate insulating layer.

According to some embodiments, the first insulating layer may include silicon oxide.

According to some embodiments, the first insulating layer may be on the second insulating layer. The second insulating layer may include silicon oxide.

According to some embodiments, the second insulating layer may be on the first insulating layer. The second insulating layer may include one of silicon nitride and silicon oxynitride.

A method of manufacturing a display device according to some embodiments may include forming an active layer including a first region and a second region on a substrate; sequentially forming a first insulating layer including silicon oxide and a second insulating layer including one of silicon nitride and silicon oxynitride on the active layer; forming a photoresist layer overlapping the first region on the second insulating layer; etching a portion of the second insulating layer overlapping the second region using the photoresist layer as an etch stopper; and removing the photoresist layer.

According to some embodiments, the method may further include forming a third insulating layer including silicon nitride on the second insulating layer.

According to some embodiments, the method may further include treating the active layer with hydrogen plasma after removing the photoresist layer.

According to some embodiments, the photoresist layer may overlap only the first region of the active layer.

According to some embodiments, the photoresist layer may overlap a remaining region of the active layer outside the second region.

A method of manufacturing a display device according to some embodiments may include forming an active layer including a first region and a second region on a substrate; forming a first insulating layer including silicon oxide on the active layer; forming a photoresist layer overlapping the first region on the first insulating layer; etching a portion of the first insulating layer overlapping the second region using the photoresist layer as an etch stopper; removing the photoresist layer; treating the active layer with hydrogen plasma after removing the photoresist layer; and forming a second insulating layer including silicon oxide on the first insulating layer.

An electronic apparatus according to some embodiments may include a display device configured to display an image; and a case accommodating the display device. The display device may include a substrate; an active layer on the substrate, the active layer including a first region and a second region; a gate insulating layer on the active layer, the gate insulating layer including a first insulating layer overlapping the first region and the second region, a second insulating layer on the first insulating layer and overlapping the first region, and a third insulating layer on the second insulating layer and overlapping the first region and the second region; and a first conductive layer on the gate insulating layer, the first conductive layer including a first gate electrode overlapping the first region to form a driving transistor, and a second gate electrode overlapping the second region to form a switching transistor. A thickness of a first portion of the gate insulating layer overlapping the first region may be greater than a thickness of a second portion of the gate insulating layer overlapping the second region.

In the display device, the method of manufacturing the same, and the apparatus including the same according to some embodiments, the equivalent oxide thickness of the gate insulating layer of the switching transistor may be less than the equivalent oxide thickness of the gate insulating layer of the driving transistor, so that the leakage current of the switching transistor may decrease, and the driving range of the driving transistor may increase.

In the display device, the method of manufacturing the same, and the apparatus including the same according to some embodiments, the hydrogen concentration of the active layer of the driving transistor may be less than the hydrogen concentration of the active layer of the switching transistor, so that the leakage current of the switching transistor may decrease, and the driving range of the driving transistor may increase.

BRIEF DESCRIPTION OF THE DRAWINGS

Illustrative, non-limiting embodiments will be more clearly understood from the following detailed description taken in conjunction with the accompanying drawings.

DETAILED DESCRIPTION

Hereinafter, display devices, methods of manufacturing display devices, and electronic apparatuses in accordance with embodiments will be explained in more detail with reference to the accompanying drawings.

Figure 1:
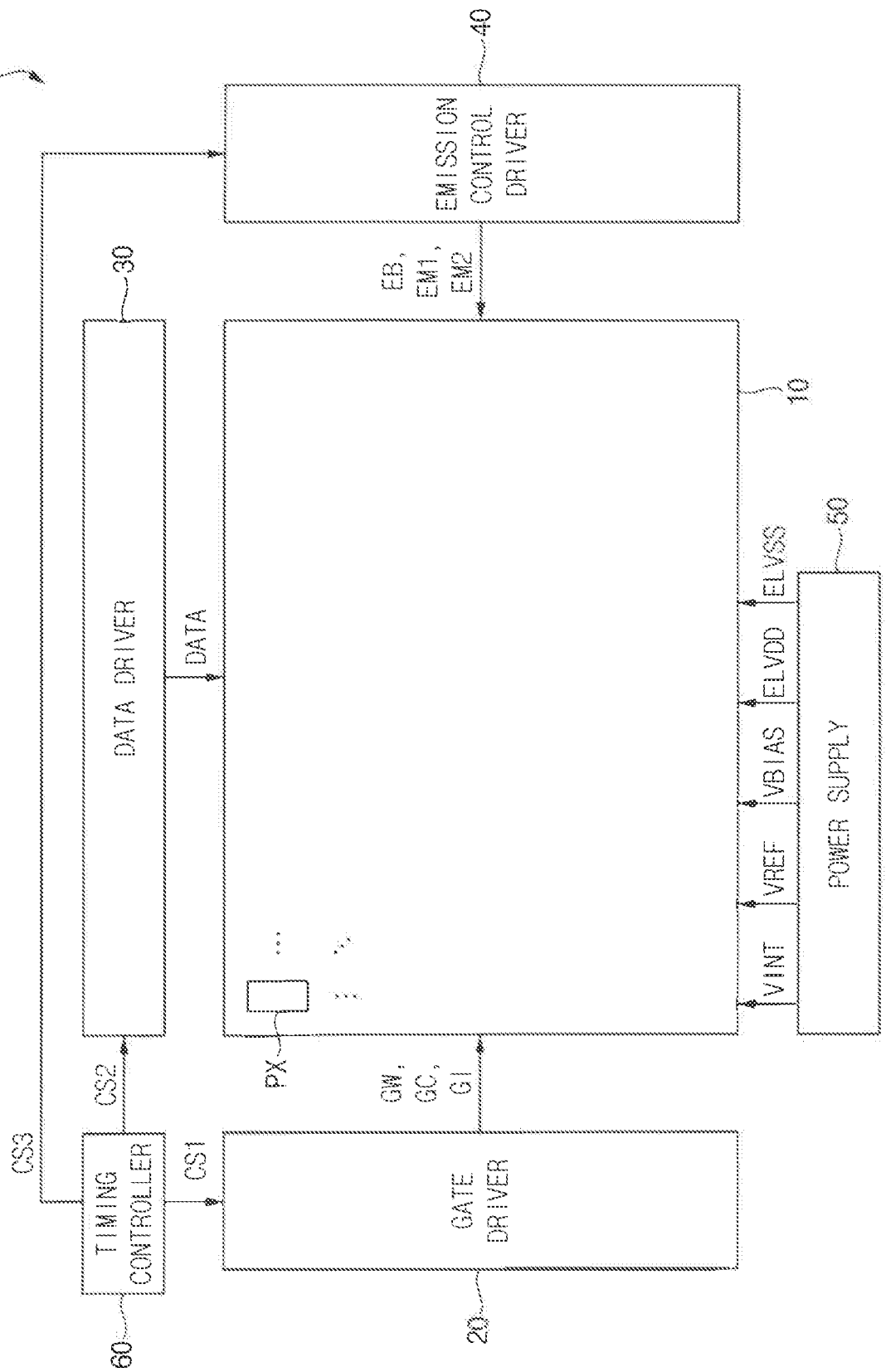
FIG. 1 is a block diagram illustrating a display device according to some embodiments.

FIG. 1 is a block diagram illustrating a display device 1 according to some embodiments.

Referring to FIG. 1, a display device 1 may include a display panel 10, a gate driver 20, a data driver 30, an emission control driver 40, a power supply 50, and a timing controller 60.

The display panel 10 may include a plurality of pixels PX. The pixels PX may be emission regions from which light is emitted in the display panel 10. According to some embodiments, each of the pixels PX may be defined by a pixel opening of a pixel defining layer 107 in FIG. 4 to be described later. The display panel 10 may display an image based on light emitted from the pixels PX.

The gate driver 20 may provide gate signals to the pixels PX. According to some embodiments, the gate signals may include a write gate signal GW, a compensation gate signal GC, an initialization gate signal GI, or the like.

The data driver 30 may provide a data voltage DATA to the pixels PX.

The emission control driver 40 may provide emission control signals to the pixels PX. According to some embodiments, the emission control signals may include a bypass control signal EB, a first emission control signal EM1, a second emission control signal EM2, or the like.

The power supply 50 may provide voltages to the pixels PX. According to some embodiments, the voltages may include an initialization voltage VINT, a reference voltage VREF, a bias voltage VBIAS, a first power voltage ELVDD, a second power voltage ELVSS, or the like.

The timing controller 60 may provide control signals to the gate driver 20, the data driver 30, and the emission control driver 40. According to some embodiments, the control signals may include a first control signal CS1 for controlling the gate driver 20, a second control signal CS2 for controlling the data driver 30, and a third control signal CS3 for controlling the emission control driver 40.

Figure 2A:
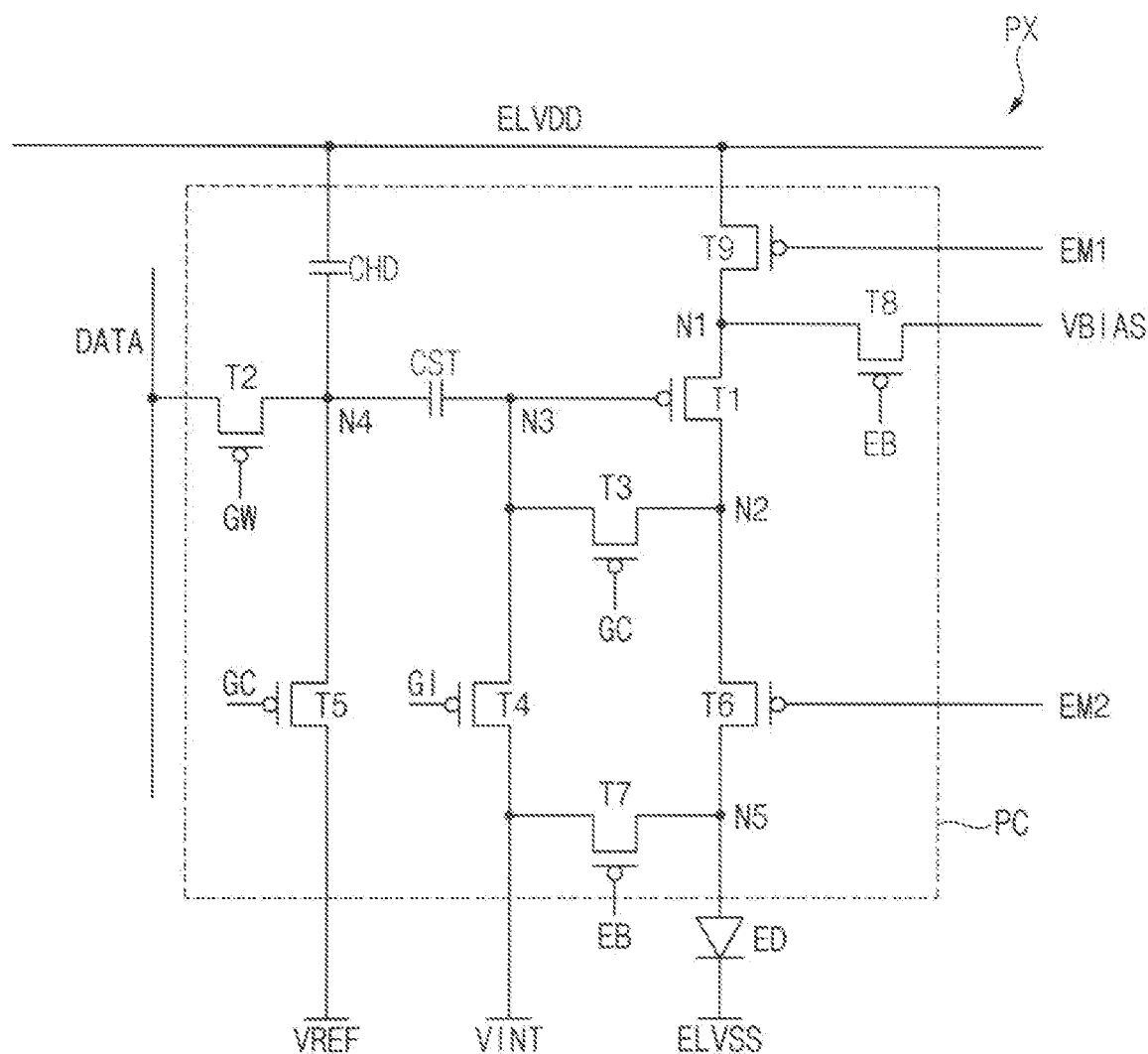
FIGS. 2A, 2B, and 2C are circuit diagrams illustrating a pixel of the display device in FIG. 1.
Figure 2B:
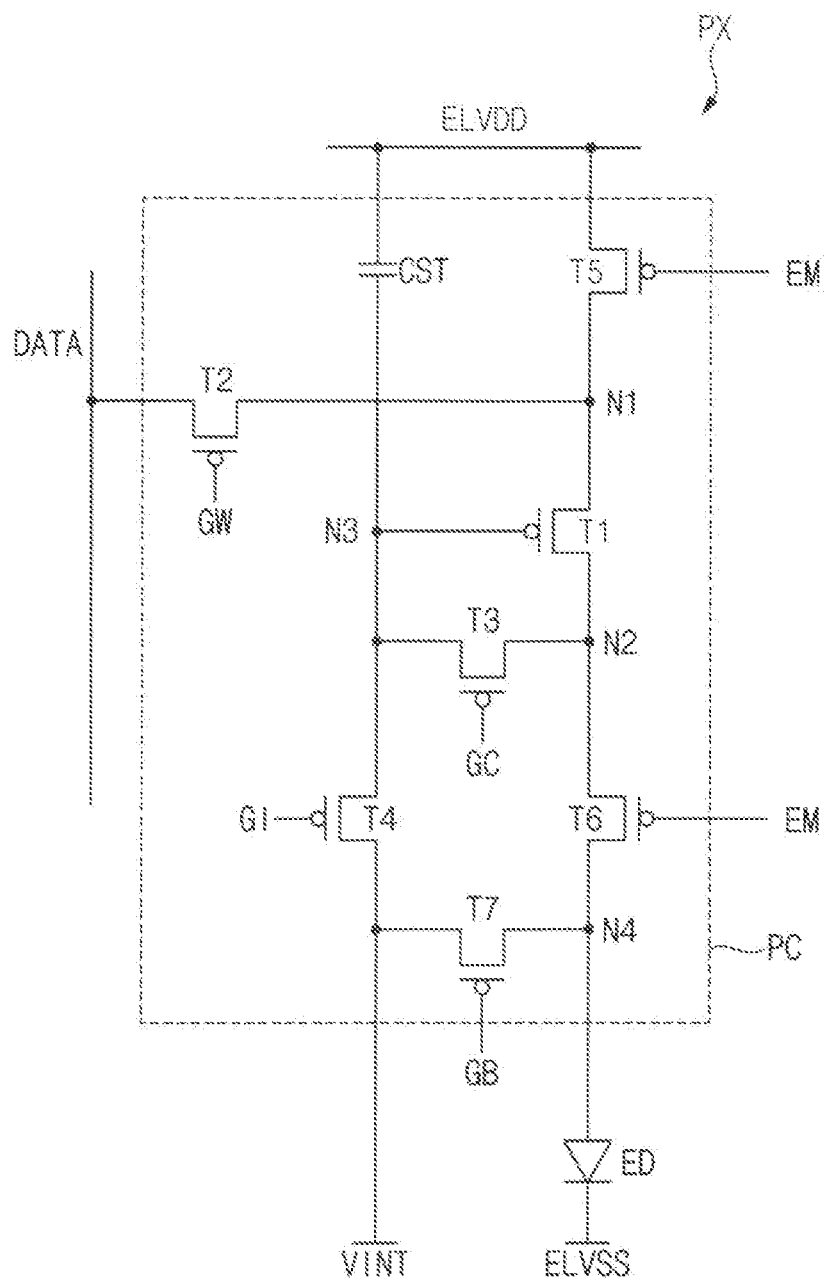
Figure 2C:
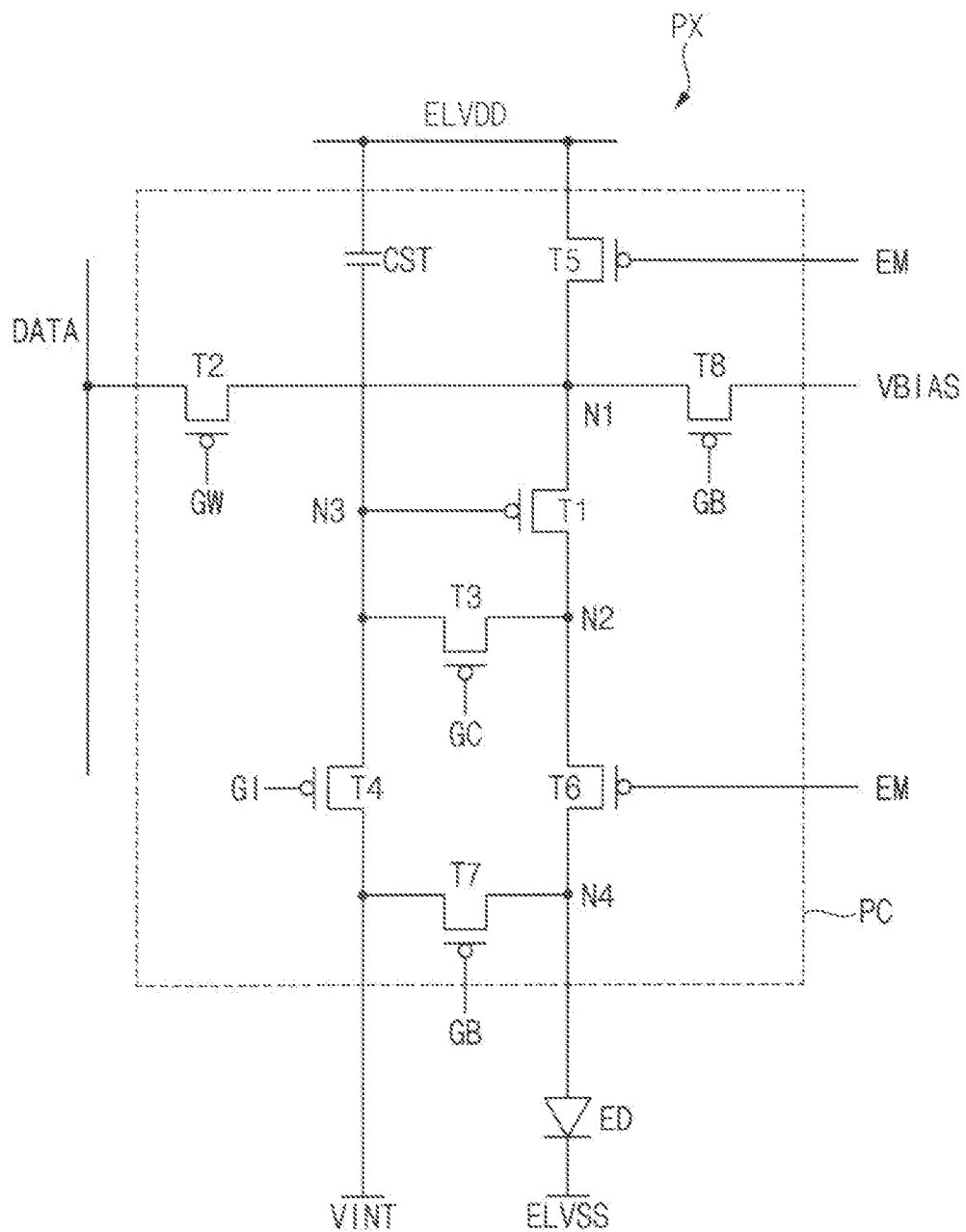

FIGS. 2A, 2B, and 2C are circuit diagrams illustrating the pixel PX of the display device 1 in FIG. 1.

Referring to FIGS. 2A, 2B, and 2C, the pixel PX may include a pixel circuit PC and a light emitting element. The pixel circuit PC may include a plurality of transistors and at least one capacitor. Embodiments according to the present disclosure are not limited to the number of components illustrated in FIGS. 2A-2C, however, and the pixel circuit PC according to some embodiments may include additional components or fewer components without departing firm the spirit and scope of embodiments according to the present disclosure.

The transistors may include a driving transistor T1 and at least one switching transistor. According to some embodiments, as illustrated in FIG. 2A, the at least one switching transistor may include a second transistor T2, a third transistor T3, a fourth transistor T4, a fifth transistor T5, a sixth transistor T6, a seventh transistor T7, an eighth transistor T8, and a ninth transistor T9. According to some embodiments, as illustrated in FIG. 2B, the at least one switching transistor may include a second transistor T2, a third transistor T3, a fourth transistor T4, a fifth transistor T5, a sixth transistor T6, and a seventh transistor T7. According to some embodiments, as illustrated in FIG. 2C, the at least one switching transistor may include a second transistor T2, a third transistor T3, a fourth transistor T4, a fifth transistor T5, a sixth transistor T6, a seventh transistor T7, and an eighth transistor T8. However, the present invention is not limited thereto, and the at least one switching transistor may include 1 to 6 or 10 or more transistors.

According to some embodiments, as illustrated in FIG. 2A, the at least one capacitor may include a storage capacitor CST and a hold capacitor CHD. According to some embodiments, as illustrated in FIGS. 2B and 2C, the at least one capacitor may include a storage capacitor CST. However, the present invention is not limited thereto, and the at least one capacitor may include three or more capacitors.

According to some embodiments, the light emitting element may include a light emitting diode ED. For example, the light emitting diode ED may include an organic light emitting diode, an inorganic light emitting diode, a quantum dot light emitting diode, or the like.

Hereinafter, based on FIG. 2A, the driving transistor T1, the second transistor T2, the third transistor T3, the fourth transistor T4, the fifth transistor T5, the sixth transistor T6, and the seventh transistor The transistor T7, the eighth transistor T8, the ninth transistor T9, the storage capacitor CST, the hold capacitor CHD, and the light emitting diode ED will be described.

A source electrode of the driving transistor T1 may be connected to a first node N1, and a drain electrode of the driving transistor T1 may be connected to a second node N2. A gate electrode of the driving transistor T1 may be connected to a third node N3. The driving transistor T1 may generate a driving current based on the first power voltage ELVDD and the data voltage DATA.

A source electrode of the second transistor T2 may receive the data voltage DATA, and the drain electrode of the second transistor T2 may be connected to a fourth node N4. A gate electrode of the second transistor T2 may receive the write gate signal GW. The second transistor T2 may transmit the data voltage DATA to the fourth node N4 in response to the write gate signal GW.

A source electrode of the third transistor T3 may be connected to the second node N2, and a drain electrode of the third transistor T3 may be connected to the third node N3. A gate electrode of the third transistor T3 may receive the compensation gate signal GC. The third transistor T3 may connect the second node N2 and the third node N3 in response to the compensation gate signal GC.

A source electrode of the fourth transistor T4 may receive the initialization voltage VINT, and a drain electrode of the fourth transistor T4 may be connected to the third node N3. A gate electrode of the fourth transistor T4 may receive the initialization gate signal GI. The fourth transistor T4 may transmit the initialization voltage VINT to the third node N3 in response to the initialization gate signal GI.

A source electrode of the fifth transistor T5 may receive the reference voltage VREF, and a drain electrode of the fifth transistor T5 may be connected to the fourth node N4. A gate electrode of the fifth transistor T5 may receive the compensation gate signal GC. The fifth transistor T5 may transmit the reference voltage VREF to the fourth node N4 in response to the compensation gate signal GC.

A source electrode of the sixth transistor T6 may be connected to the second node N2, and a drain electrode of the sixth transistor T6 may be connected to a fifth node N5. A gate electrode of the sixth transistor T6 may receive the second emission control signal EM2. The sixth transistor T6 may connect the second node N2 and the fifth node N5 in response to the second emission control signal EM2.

A source electrode of the seventh transistor T7 may receive the initialization voltage VINT, and a drain electrode of the seventh transistor T7 may be connected to the fifth node N5. A gate electrode of the seventh transistor T7 may receive the bias control signal EB. The seventh transistor T7 may transmit the initialization voltage VINT to the fifth node N5 in response to the bias control signal EB.

A source electrode of the eighth transistor T8 may receive the bias voltage VBIAS, and a drain electrode of the eighth transistor T8 may be connected to the first node N1. A gate electrode of the eighth transistor T8 may receive the bias control signal EB. The eighth transistor T8 may transmit the bias voltage VBIAS to the first node N1 in response to the bias control signal EB.

A source electrode of the ninth transistor T9 may receive the first power voltage ELVDD, and a drain electrode of the ninth transistor T9 may be connected to the first node N1. A gate electrode of the ninth transistor T9 may receive the first emission control signal EM1. The ninth transistor T9 may transmit the first power voltage ELVDD to the first node N1 in response to the first emission control signal EM1.

According to some embodiments, each of the transistors T1, T2, T3, T4, T5, T6, T7, T8, and T9 may be a PMOS transistor as illustrated in FIGS. 2A, 2B, and 2C. However, the present invention is not limited thereto, and according to some embodiments, at least one of the transistors T1, T2, T3, T4, T5, T6, T7, T8, or T9 may be an NMOS transistor.

A first electrode of the storage capacitor CST may be connected to the third node N3, and a second electrode of the storage capacitor CST may be connected to the fourth node N4. A first electrode of the hold capacitor CHD may be connected to the fourth node N4, and a second electrode of the hold capacitor CHD may receive the first power voltage ELVDD.

A first electrode of the light emitting diode ED may be connected to the fifth node N5, and a second electrode of the light emitting diode ED may receive the second power voltage ELVSS. The light emitting diode ED may emit light based on the driving current transmitted from the driving transistor T1.

The storage capacitor CST may be connected to the gate electrode of the driving transistor T1, and the second transistor T2, the third transistor T3, the fourth transistor T4, and the fifth transistor T5 may be connected to the first electrode or the second electrode of the storage capacitor CST. When a leakage current of each of the second transistor T2, the third transistor T3, the fourth transistor T4, and the fifth transistor T5 increases, the driving current generated by the driving transistor T1 may change, and accordingly, a luminance of light emitted from the light emitting diode ED may change based on the driving current. Accordingly, when the leakage current of each of the second transistor T2, the third transistor T3, the fourth transistor T4, and the fifth transistor T5 increases, the pixel PX may not stably express colors.

Figure 3:
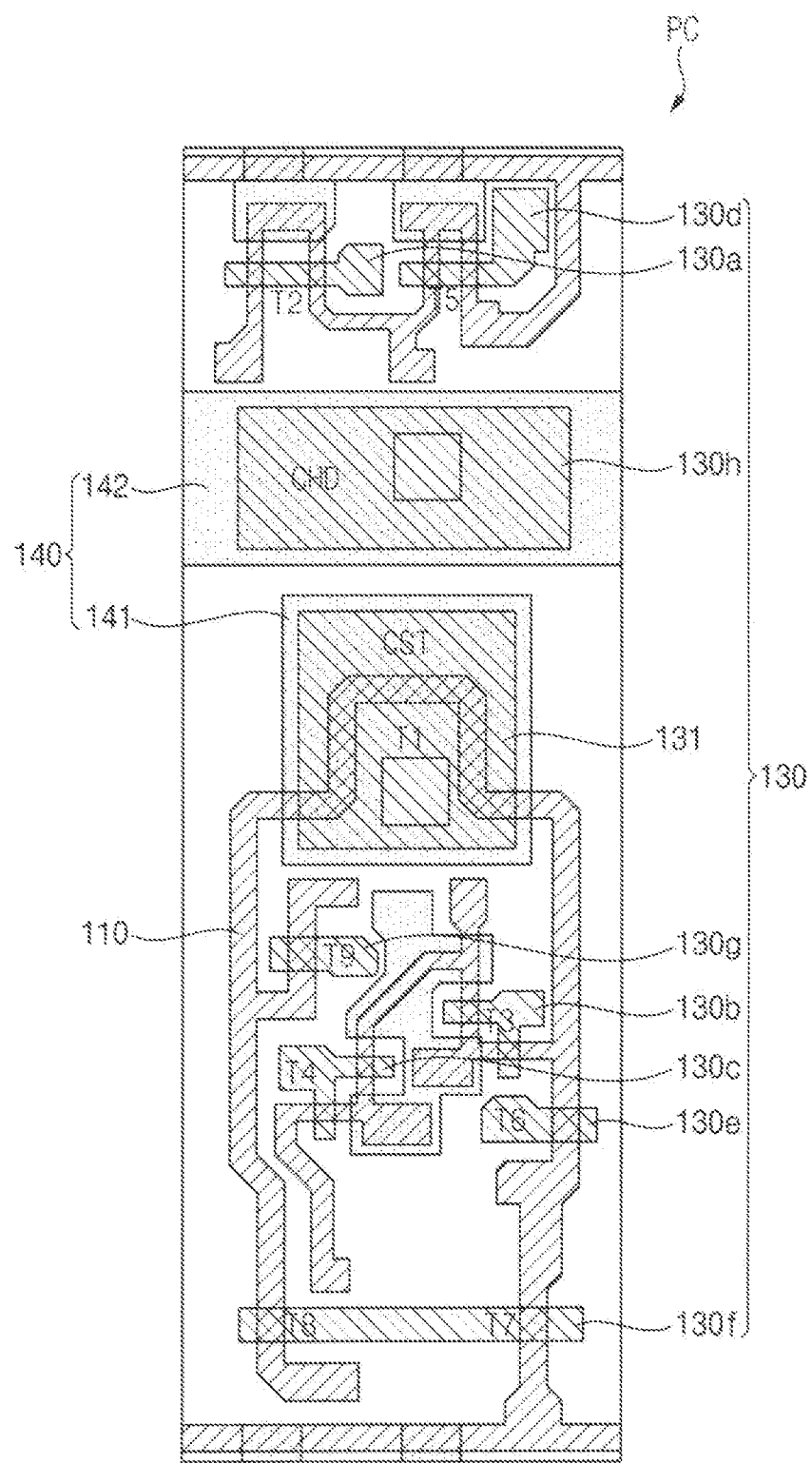
FIG. 3 is a plan view illustrating transistors and capacitors of a pixel circuit included in the pixel in FIG. 2A.

FIG. 3 is a plan view illustrating the transistors T1, T2, T3, T4, T5, T6, T7, T8, and T9 and the capacitors CST and CHD of the pixel circuit PC included in the pixel PX in FIG. 2A.

Referring to FIG. 3, the pixel circuit PC may include an active layer 110, a first conductive layer 130, and a second conductive layer 140.

The source electrode, the channel, and the drain electrode of each of the transistors T1, T2, T3, T4, T5, T6, T7, T8, and T9 may be arranged along the active layer 110.

The first conductive layer 130 may be located on the active layer 110. The first conductive layer 130 may include a first gate electrode 131, a first gate pattern 130a, a second gate pattern 130b, a third gate pattern 130c, a fourth gate pattern 130d, a fifth gate pattern 130e, a sixth gate pattern 130f, a seventh gate pattern 130g, and an eighth gate pattern 130h. At least a portion of each of the first gate electrode 131, the first gate pattern 130a, the second gate pattern 130b, the third gate pattern 130c, the fourth gate pattern 130d, the fifth gate pattern 130e, the sixth gate pattern 130f, and the seventh gate pattern 130g may overlap the active layer 110.

The first gate electrode 131 may be the gate electrode of the driving transistor T1 and the first electrode of the storage capacitor CST. The first gate pattern 130a may be the gate electrode of the second transistor T2. The second gate pattern 130b may be the gate electrode of the third transistor T3. The third gate pattern 130c may be the gate electrode of the fourth transistor T4. The fourth gate pattern 130d may be the gate electrode of the fifth transistor T5. The fifth gate pattern 130e may be the gate electrode of the sixth transistor T6. The sixth gate pattern 130f may include the gate electrode of the seventh transistor T7 and the gate electrode of the eighth transistor T8. The seventh gate pattern 130g may be the gate electrode of the ninth transistor T9. The eighth gate pattern 130h may be the first electrode of the hold capacitor CHD.

The second conductive layer 140 may be located on the first conductive layer 130. The second conductive layer 140 may include a first capacitor electrode 141 and a second capacitor electrode 142. The first capacitor electrode 141 and the second capacitor electrode 142 may overlap the first gate electrode 131 and the eighth gate pattern 130h, respectively.

The first capacitor electrode 141 may be the second electrode of the storage capacitor CST. The second capacitor electrode 142 may be the second electrode of the hold capacitor CHD.

Figure 4:
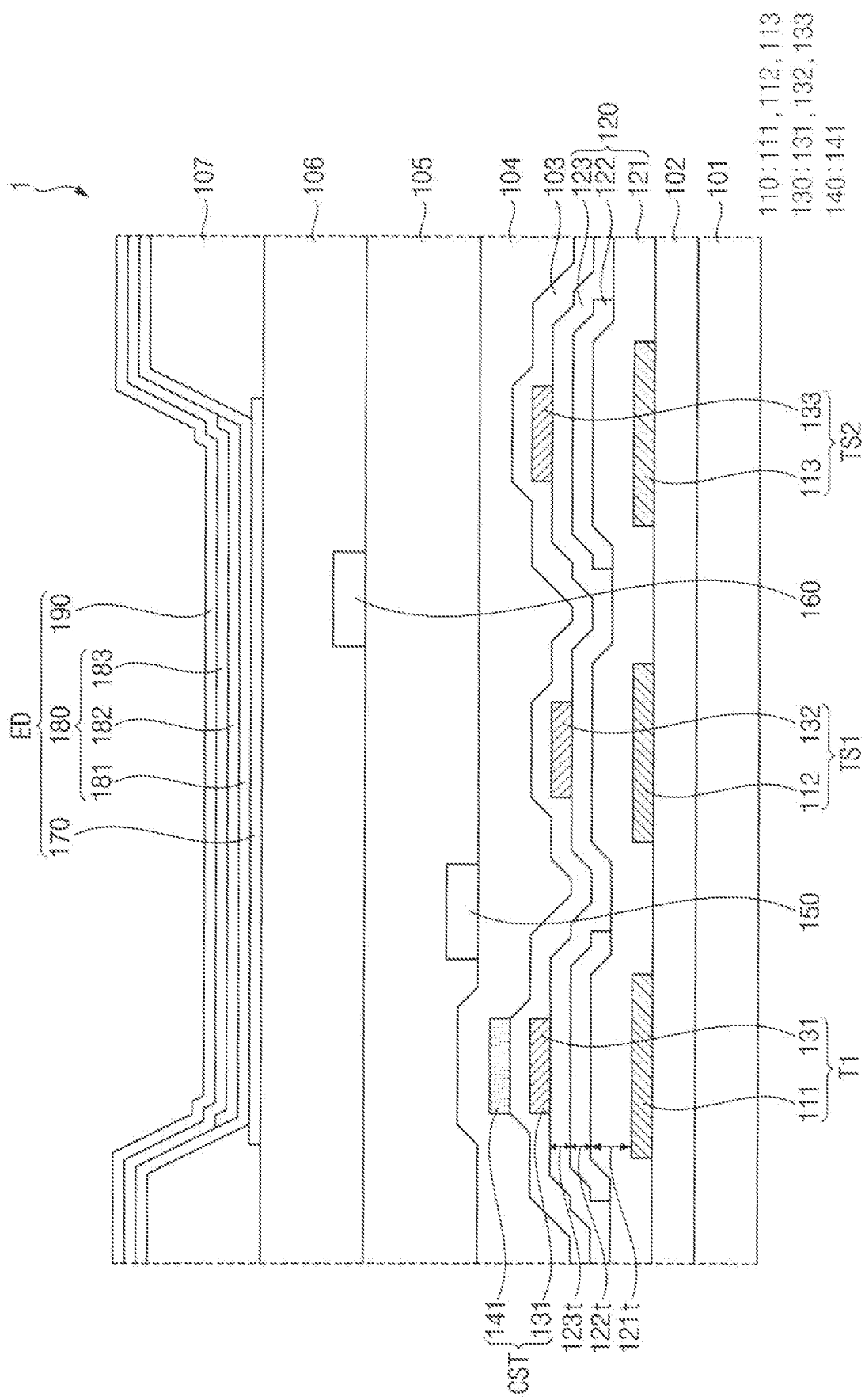
FIG. 4 is a cross-sectional view illustrating a display device according to some embodiments.

FIG. 4 is a cross-sectional view illustrating a display device 1 according to some embodiments.

A first switching transistor TS1 illustrated in FIG. 4 may be any one of the second transistor T2, the third transistor T3, the fourth transistor T4, and the fifth transistor T5 illustrated in FIG. 3. A second switching transistor TS2 illustrated in FIG. 4 may be any one of the sixth transistor T6, the seventh transistor T7, the eighth transistor T8, and the ninth transistor T9 illustrated in FIG. 3.

Referring to FIGS. 3 and 4, the display device 1 may include a substrate 101, a buffer layer 102, an active layer 110, a gate insulating layer 120, a first conductive layer 130, a first insulation interlayer 103, a second conductive layer 140, a second insulating interlayer 104, a third conductive layer 150, a first via insulating layer 105, a fourth conductive layer 160, a second via insulating layer 106, a first electrode 170, a pixel defining layer 107, an intermediate layer 180, and a second electrode 190.

The substrate 101 may include glass, polymer resin, or the like. For example, the polymer resin may include polyethersulfone, polyarylate, polyetherimide, polyethylene naphthalate, polyethylene terephthalate, polyphenylene sulfide, polyimide, polycarbonate, cellulose triacetate, cellulose acetate propionate, or the like.

The buffer layer 102 may be located on the substrate 101. The buffer layer 102 may include silicon oxide, silicon nitride, or the like. The buffer layer 102 may have a single-layer structure or a multilayer structure. According to some embodiments, the buffer layer 102 may have a multilayer structure including a silicon nitride layer and a silicon oxide layer that are sequentially stacked.

The active layer 110 may be located on the buffer layer 102. According to some embodiments, the active layer 110 may include amorphous silicon, polycrystalline silicon, or the like. According to some embodiments, the active layer 110 may include an oxide semiconductor.

The active layer 110 may include a first region 111, a second region 112, and a third region 113. The first region 111 may include the source electrode, the channel, and the drain electrode of the driving transistor T1. The second region 112 may include the source electrode, the channel, and the drain electrode of each of the second to fifth transistors T2-T5. The third region 113 may include the source electrode, the channel, and the drain electrode of each of the sixth to ninth transistors T6-T9.

A hydrogen concentration of the second region 112 may be greater than a hydrogen concentration of the first region 111. A hydrogen concentration of the third region 113 may be substantially equal to the hydrogen concentration of the first region 111.

Because the hydrogen concentration of the second region 112 is relatively large, a leakage current of the first switching transistor TS1 including the second region 112 of the active layer 110 may be relatively small. Further, because the hydrogen concentration of the first region 111 is relatively small, a driving range of the driving transistor T1 including the first region 111 of the active layer 110 may be relatively large.

The gate insulating layer 120 may be located on the active layer 110. The gate insulating layer 120 may include a first insulating layer 121, a second insulating layer 122, and a third insulating layer 123.

The first insulating layer 121 may be located on the buffer layer 102, and may cover the active layer 110. The first insulating layer 121 may overlap the first region 111, the second region 112, and the third region 113 of the active layer 110. According to some embodiments, the first insulating layer 121 may be entirely located on an upper surface of the substrate 101.

The first insulating layer 121 may include silicon oxide.

According to some embodiments, a thickness 121t of the first insulating layer 121 may be about 600 angstroms (Å) to about 1200 Å. When the thickness 121t of the first insulating layer 121 is less than about 600 Å, the amount of hydrogen flowing into the first region 111 of the active layer 110 through the first insulating layer 121 may excessively increase. Further, when the thickness 121t of the first insulating layer 121 is greater than about 1200 Å, the amount of hydrogen flowing into the second region 112 of the active layer 110 through the first insulating layer 121 may be excessively decrease.

The second insulating layer 122 may be located on the first insulating layer 121. The second insulating layer 122 may overlap the first region 111 and the third region 113 of the active layer 110, and may not overlap the second region 112 of the active layer 110. According to some embodiments, the second insulating layer 122 may overlap only the first region 111 and the third region 113 of the active layer 110. According to some embodiments, the second insulating layer 122 may overlap a remaining region of the active layer 110 outside the second region 112 of the active layer 110.

According to some embodiments, the second insulating layer 122 may include silicon nitride.

According to some embodiments, a hydrogen concentration of the second insulating layer 122 including silicon nitride may be substantially equal to a hydrogen concentration of the third insulating layer 123 including silicon nitride.

According to some embodiments, the hydrogen concentration of the second insulating layer 122 including silicon nitride may be less than the hydrogen concentration of the third insulating layer 123 including silicon nitride. According to some embodiments, a value [N—H]/[Si—H] (a ratio of a nitrogen-hydrogen bond concentration to a silicon-hydrogen bond concentration) of the second insulating layer 122 may be about 14 to about 30.

According to some embodiments, the second insulating layer 122 may include silicon oxynitride. According to some embodiments, an atomic percentage of nitrogen in the second insulating layer 122 may be about 10% to about 50%.

When the atomic percentage of nitrogen in the second insulating layer 122 is less than about 10%, a difference between an etch selectivity of the first insulating layer 121 and an etch selectivity of the second insulating layer 122 may excessively decrease, so that the first insulating layer 121 may be etched together with the second insulating layer 122 in the process of etching the second insulating layer 122. Further, when the atomic percentage of nitrogen in the second insulating layer 122 is greater than about 50%, as a dielectric constant of the second insulating layer 122 increases, an equivalent oxide thickness ("EOT") of the second insulating layer 122 may excessively decrease.

According to some embodiments, a thickness 122t of the second insulating layer 122 may be about 200 Å to about 600 Å.

The third insulating layer 123 may be located on the second insulating layer 122. The third insulating layer 123 may overlap the first region 111, the second region 112, and the third region 113 of the active layer 110. According to some embodiments, the third insulating layer 123 may be entirely located on the upper surface of the substrate 101.

The third insulating layer 123 may include silicon nitride. Because silicon nitride contains a relatively large amount of hydrogen, hydrogen may flow into the active layer 110 from the third insulating layer 123 including silicon nitride. According to some embodiments, a thickness 123t of the third insulating layer 123 may be about 200 Å to about 600 Å.

A thickness of a first portion of the gate insulating layer 120 overlapping the first region 111 of the active layer 110 may be greater than a thickness of a second portion of the gate insulating layer 120 overlapping the second region 112 of the active layer 110. The thickness of the first portion of the gate insulating layer 120 may be the sum of the thickness 121t of the first insulating layer 121, the thickness 122t of the second insulating layer 122, and the thickness of the third insulating layer 123, and the thickness of the second portion of the gate insulating layer 120 may be the sum of the thickness 121t of the first insulating layer 121 and the thickness 123t of the third insulating layer 123. A thickness of a third portion of the gate insulation layer 120 overlapping the third region 113 of the active layer 110 may be substantially equal to the thickness of the first portion of the gate insulation layer 120.

An equivalent oxide thickness of the first portion of the gate insulation layer 120 may be greater than an equivalent oxide thickness of the second portion of the gate insulation layer 120. An equivalent oxide thickness of the third portion of the gate insulating layer 120 may be substantially equal to the equivalent oxide thickness of the first portion of the gate insulating layer 120. Equation 1 is an equation for obtaining an equivalent oxide thickness. In Equation 1, EOT denotes the equivalent oxide thickness, $\varepsilon_{SiOx}$ denotes a dielectric constant of silicon oxide, $\varepsilon$ denotes a dielectric constant of an insulating layer, and T denotes a thickness of the insulating layer. Table 1 illustrates dielectric constants of silicon oxide, silicon oxynitride, and silicon nitride.

$$EOT=(\varepsilon_{SiOx}/\varepsilon)\times T \qquad [\text{Equation 1}]$$

TABLE 1

|  | O [at. %] | N [at. %] | ε |
|---|---|---|---|
| $SiO_2$ | 100 | 0 | 3.750 |
| $SiO_xN_y$ | 90 | 10 | 4.105 |
| $SiO_xN_y$ | 80 | 20 | 4.460 |

TABLE 1-continued

| | O [at. %] | N [at. %] | ε |
|---|---|---|---|
| $SiO_xN_y$ | 70 | 30 | 4.815 |
| $SiO_xN_y$ | 60 | 40 | 5.170 |
| $SiO_xN_y$ | 50 | 50 | 5.525 |
| $SiO_xN_y$ | 40 | 60 | 5.880 |
| $SiO_xN_y$ | 30 | 70 | 6.235 |
| $SiO_xN_y$ | 20 | 80 | 6.590 |
| $SiO_xN_y$ | 10 | 90 | 6.945 |
| $Si_3N_4$ | 0 | 100 | 7.200 |

According to some embodiments, when the thickness 121t of the first insulating layer 121 including silicon oxide is 900 Å, the thickness 122t of the second insulating layer 122 including silicon nitride is 400 Å, and the thickness 123t of the third insulating layer 123 including silicon nitride is 400 Å, the equivalent oxide thickness of the first portion of the gate insulating layer 120 is about 1367 Å (=900 Å+(4.2/7.2)×400 Å+(4.2/7.2)×400 Å), and the equivalent oxide thickness of the second portion of the gate insulating layer 120 is about 1133 Å (=900 Å+(4.2/7.2)×400 Å).

According to some embodiments, when the thickness 121t of the first insulating layer 121 including silicon oxide is 900 Å, the thickness 122t of the second insulating layer 122 including silicon oxynitride in which atomic percentage of nitrogen is 30% is 400 Å, and the thickness 123t of the third insulating layer 123 including silicon nitride is 400 Å, the equivalent oxide thickness of the first portion of the gate insulating layer 120 is about 1483 Å (=900 Å+(4.2/4.8)×400 Å+(4.2/7.2)×400 Å), and the equivalent oxide thickness of the second portion of gate insulating layer 120 is about 1133 Å (=900 Å+(4.2/7.2)×400 Å).

Because the equivalent oxide thickness of the first portion of the gate insulating layer 120 is relatively large, the driving range of the driving transistor T1 may be relatively large. Further, because the equivalent oxide thickness of the second portion of the gate insulating layer 120 is relatively small, the leakage current of the first switching transistor TS1 may be relatively small.

In general, a leakage current and a driving range of a transistor may decrease when a hydrogen concentration of an active layer increases or an equivalent oxide thickness of a gate insulating layer decreases, and the leakage current and driving range of the transistor may increase when the hydrogen concentration of the active layer decreases or the equivalent oxide thickness of the gate insulating layer increases. In the prior art, when the hydrogen concentration of the active layer increases or the equivalent oxide thickness of the gate insulating layer decreases in order to decrease the leakage current of the switching transistor, the driving range of the driving transistor may decrease so that a range of color that can be expressed by the pixel may be reduced. Further, in the prior art, when the hydrogen concentration of the active layer decreases or the equivalent oxide thickness of the gate insulating layer increases in order to increase the driving range of the driving transistor, the leakage current of the switching transistor may increase so that the pixel may not stably express color.

However, according to some embodiments of the present invention, as the hydrogen concentration of the second region 112 of the active layer 110 increases or the equivalent oxide thickness of the second portion of the gate insulating layer 120 decreases, the leakage current of the switching transistor TS1 may decrease. Further, according to some embodiments of the present invention, as the hydrogen concentration of the first region 111 of the active layer 110 decreases or the equivalent oxide thickness of the first portion of the gate insulating layer 120 increases, the driving range of the transistor T1 may increase.

The first conductive layer 130 may be located on the gate insulating layer 120. The first conductive layer 130 may include a conductive material. The first conductive layer 130 may have a single-layer structure or a multilayer structure. According to some embodiments, the first conductive layer 130 may have a single-layer structure including a molybdenum (Mo) layer. The first conductive layer 130 may include a first gate electrode 131, a second gate electrode 132, and a third gate electrode 133.

The first gate electrode 131 may overlap the first region 111 of the active layer 110. The first region 111 of the active layer 110 and the first gate electrode 131 may form the driving transistor T1.

According to some embodiments, the second region 112 of the active layer 110 may be electrically connected to the first gate electrode 131. When the first switching transistor TS1 is any one of the third transistor T3 in FIGS. 2A to 2C and the fourth transistor T4 in FIGS. 2A to 2C, the second region 112 of the active layer 110 may be electrically connected to the first gate electrode 131.

The second gate electrode 132 may overlap the second region 112 of the active layer 110. The second gate electrode 132 may be any one of the first gate pattern 130a, the second gate pattern 130b, the third gate pattern 130c, and the fourth gate pattern 130d. The second region 112 of the active layer 110 and the second gate electrode 132 may form the first switching transistor TS1.

The third gate electrode 133 may overlap the third region 113 of the active layer 110. The third gate electrode 133 may be any one of the fifth gate pattern 130e, the sixth gate pattern 130f, and the seventh gate pattern 130g. The third region 113 of the active layer 110 and the third gate electrode 133 may form the second switching transistor TS2.

The first insulating interlayer 103 may be located on the first conductive layer 130. The first insulating interlayer 103 may include silicon oxide, silicon nitride, or the like. The first insulating interlayer 103 may have a single-layer structure or a multilayer structure. According to some embodiments, the first insulating interlayer 103 may have a single-layer structure including a silicon nitride layer.

The second conductive layer 140 may be located on the first insulating interlayer 103. The second conductive layer 140 may include a conductive material. The second conductive layer 140 may have a single-layer structure or a multilayer structure. According to some embodiments, the second conductive layer 140 may have a single-layer structure including a molybdenum (Mo) layer. The second conductive layer 140 may include a first capacitor electrode 141.

The first capacitor electrode 141 may overlap the first gate electrode 131. The first gate electrode 131 and the first capacitor electrode 141 may form the storage capacitor CST.

According to some embodiments, the second region 112 of the active layer 110 may be electrically connected to the first capacitor electrode 141. When the first switching transistor TS1 is any one of the second transistor T2 in FIG. 2A and the fifth transistor T5 in FIG. 2A, the second region 112 of the active layer 110 may be electrically connected to the first capacitor electrode 141.

The second insulating interlayer 104 may be located on the second conductive layer 140. The second insulating interlayer 104 may include silicon oxide, silicon nitride, or the like. The second insulating interlayer 104 may have a single-layer structure or a multilayer structure. According to some embodiments, the second insulating interlayer 104 may have a multilayer structure including a silicon oxide layer and a silicon nitride layer that are sequentially stacked.

The third conductive layer 150 may be located on the second insulating interlayer 104. The third conductive layer 150 may include a conductive material. The third conductive layer 150 may have a single-layer structure or a multilayer structure. According to some embodiments, the third conductive layer 150 may have a multilayer structure including a titanium (Ti) layer, an aluminum (Al) layer, and a titanium (Ti) layer that are sequentially stacked. The third conductive layer 150 may includes lines that transmit the write gate signal GW in FIG. 2A, the compensation gate signal GC in FIG. 2A, the initialization gate signal GI in FIG. 2A, the bypass control signal EB in FIG. 2A, the first emission control signal EM1 in FIG. 2A, the second emission control signal EM2 in FIG. 2A, the initialization voltage VINT in FIG. 2A, the reference voltage VREF in FIG. 2A, and the bias voltage VBIAS in FIG. 2A.

The first via insulating layer 105 may be located on the third conductive layer 150. The first via insulating layer 105 may include an organic insulating material and/or an inorganic insulating material. The first via insulating layer 105 may have a single-layer structure or a multilayer structure. According to some embodiments, the first via insulating layer 105 may have a single-layer structure including a polyimide (PI) layer.

The fourth conductive layer 160 may be located on the first via insulating layer 105. The fourth conductive layer 160 may include a conductive material. The fourth conductive layer 160 may have a single-layer structure or a multilayer structure. According to some embodiments, the fourth conductive layer 160 may have a multilayer structure including a titanium (Ti) layer, an aluminum (Al) layer, and a titanium (Ti) layer that are sequentially stacked. The fourth conductive layer 160 may include lines that transmit the data voltage DATA in FIG. 2A and the first power voltage ELVDD in FIG. 2A. The active layer 110, the gate insulating layer 120, the first conductive layer 130, the first insulating interlayer 103, the second conductive layer 140, the second insulating interlayer 104, the third conductive layer 150, the first via insulating layer 105, and the fourth conductive layer 160 may form the pixel circuit PC.

The second via insulating layer 106 may be located on the fourth conductive layer 160. The second via insulating layer 106 may include an organic insulating material and/or an inorganic insulating material. The second via insulating layer 106 may have a single-layer structure or a multilayer structure. According to some embodiments, the second via insulating layer 106 may have a single-layer structure including a polyimide (PI) layer.

The first electrode 170 may be located on the second via insulating layer 106. The first electrode 170 may include a transparent conductive oxide, a metal, or the like. The first electrode 170 may have a single-layer structure or a multilayer structure. According to some embodiments, the first electrode 170 may have a multilayer structure including an indium tin oxide (ITO) layer, a silver (Ag) layer, and an indium tin oxide (ITO) layer that are sequentially stacked.

The pixel defining layer 107 may be located on the first electrode 170. The pixel defining layer 107 may define a pixel opening exposing at least a portion of the first electrode 170. The pixel defining layer 107 may include an organic insulating material and/or an inorganic insulating material. The pixel defining layer 107 may have a single-layer structure or a multilayer structure. According to some embodiments, the pixel defining layer 107 may have a single-layer structure including a polyimide (PI) layer.

The intermediate layer 180 may be located on the first electrode 170 exposed by the pixel opening and the pixel defining layer 107. The intermediate layer 180 may include a first functional layer 181, an emission layer 182, and a second functional layer 183.

The first functional layer 181 may be located on the first electrode 170 exposed by the pixel opening and the pixel defining layer 107. The first functional layer 181 may include a hole injection layer ("HIL") and/or a hole transport layer ("HTL"). Alternatively, the first functional layer 181 may be omitted.

The emission layer 182 may be located on the first functional layer 181. The emission layer 182 may be located in the pixel opening. The light emitting layer 181 may include an organic light emitting material, an inorganic light emitting material, a quantum dot, or the like.

According to some embodiments, the organic light emitting material may include a low molecular weight organic compound or a high molecular weight organic compound. For example, the low molecular weight organic compound may include copper phthalocyanine, N,N'-diphenylbenzidine, tris-(8-hydroxyquinoline)aluminum, or the like, and the high molecular weight organic compound may include poly(3,4-ethylenedioxythiophene), polyaniline, poly-phenylenevinylene, polyfluorene, or the like.

According to some embodiments, the quantum dot may include a core including a group II-VI compound, a group III-V compound, a group IV-VI compound, a group IV element, a group IV compound, and combinations thereof. According to some embodiments, the quantum dot may have a core-shell structure including the core and a shell surrounding the core. The shell may serve as a protective layer for maintaining semiconductor properties by preventing chemical modification of the core and as a charging layer for imparting electrophoretic properties to the quantum dot.

The second functional layer 183 may be located on the first functional layer 181 with the emission layer 182 interposed therebetween. The second functional layer 183 may include an electron transport layer ("ETL") and/or an electron injection layer ("EIL"). Alternatively, the second functional layer 183 may be omitted.

The second electrode 190 may be located on the intermediate layer 180. The second electrode 190 may include a transparent conductive oxide, a metal, or the like. The second electrode 190 may have a single-layer structure or a multilayer structure. The first electrode 170, the intermediate layer 180, and the second electrode 190 may form a light emitting diode ED.

FIGS. 5, 6, 7, 8, 9, 10, 11, 12, 13, 14, 15, 16, and 17 are diagrams illustrating a method of manufacturing a display device according to some embodiments. For example, FIGS. 5 to 17 may illustrate the manufacturing method of the display device 1 described with reference to FIGS. 3 and 4.

Figure 5:
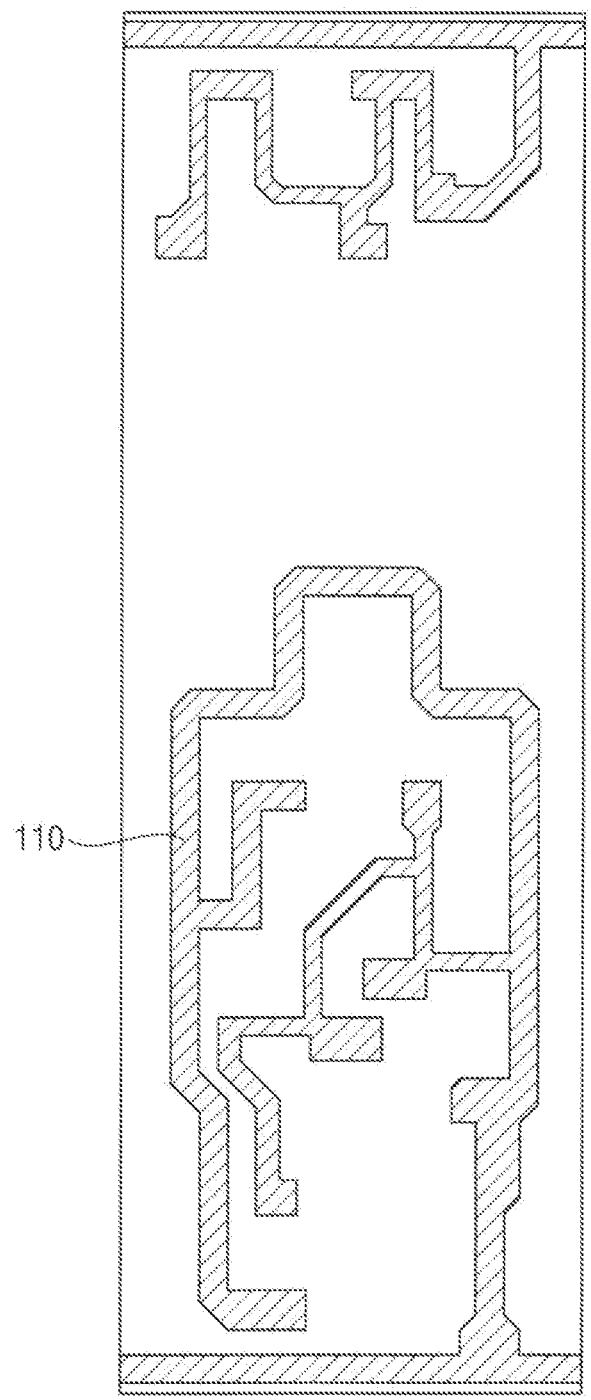
FIGS. 5, 6, 7, 8, 9, 10, 11, 12, 13, 14, 15, 16, and 17 are diagrams illustrating a method of manufacturing a display device according to some embodiments.
Figure 6:
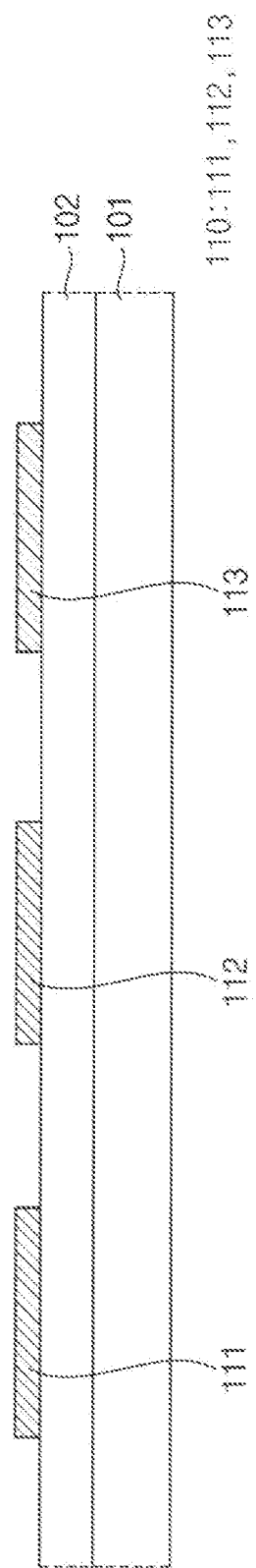

Referring to FIGS. 5 and 6, the active layer 110 may be formed on the substrate 101. According to some embodiments, after an amorphous silicon layer is formed on the buffer layer 102, a polycrystalline silicon layer may be formed by crystallizing the amorphous silicon layer. Then, the active layer 110 may be formed by patterning the polycrystalline silicon layer.

Figure 7:
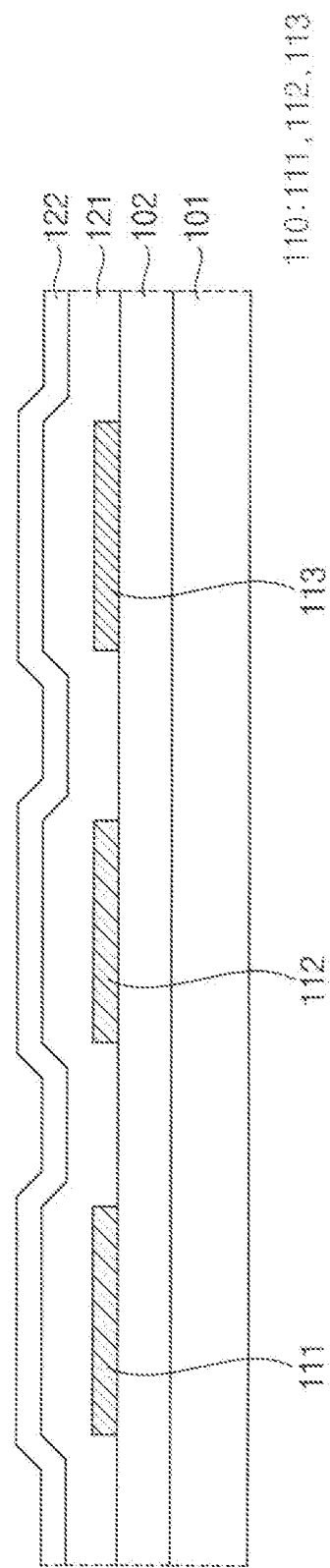

Referring to FIG. 7, the first insulating layer 121 and the second insulating layer 122 may be sequentially formed on the active layer 110. First, the first insulating layer 121 including silicon oxide may be formed on the active layer 110. Then, the second insulating layer 122 including one of silicon nitride and silicon oxynitride may be formed on the first insulating layer 121.

Figure 8:
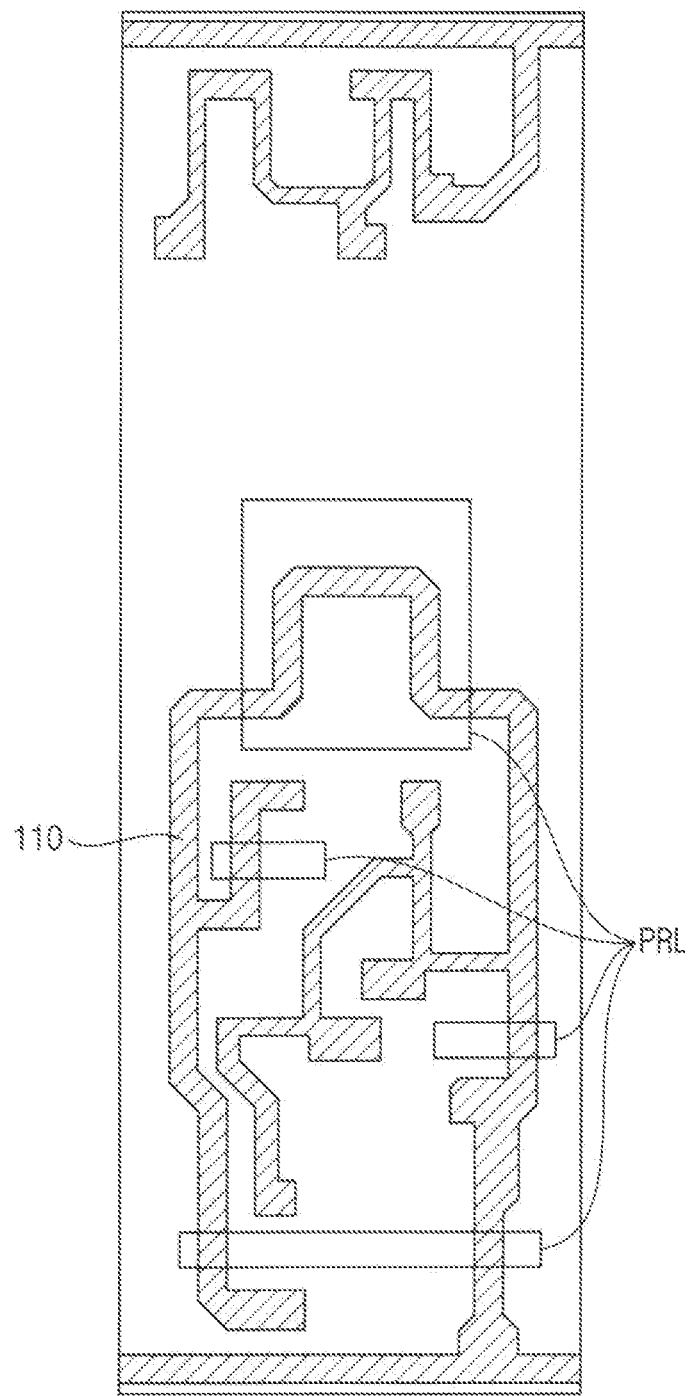
Figure 9:
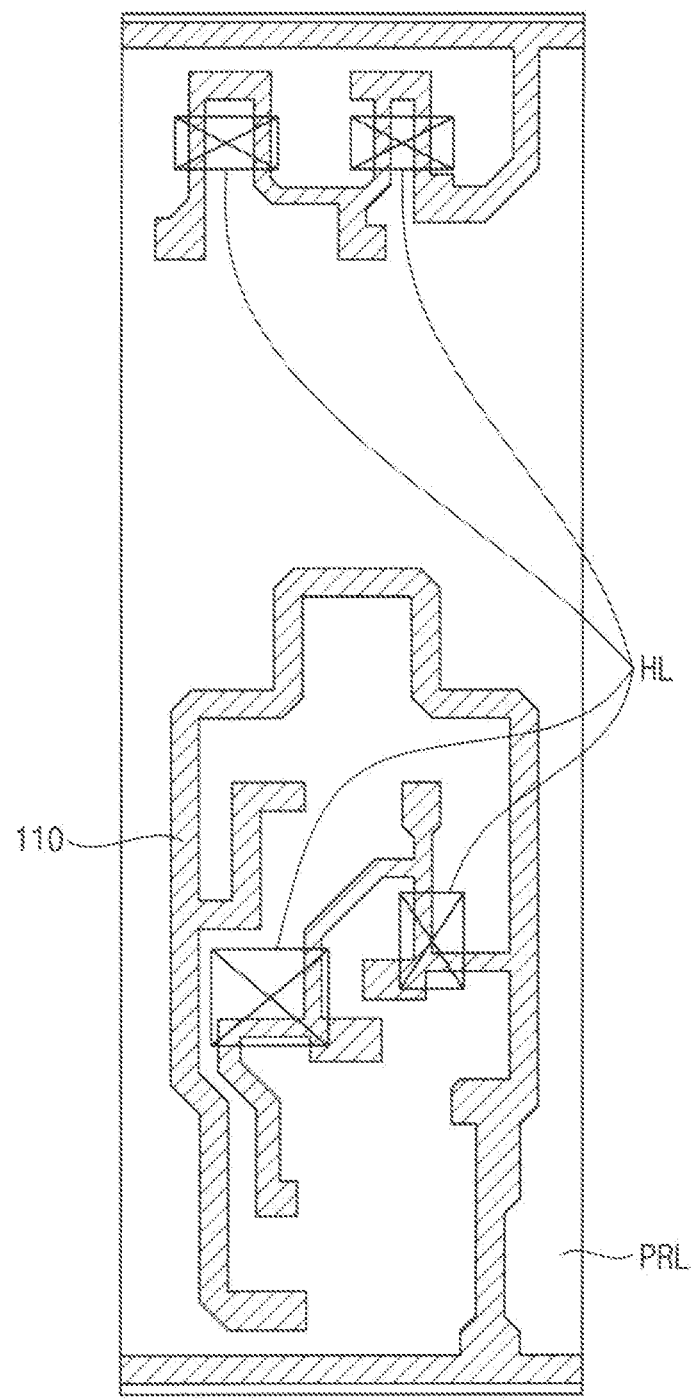
Figure 10:
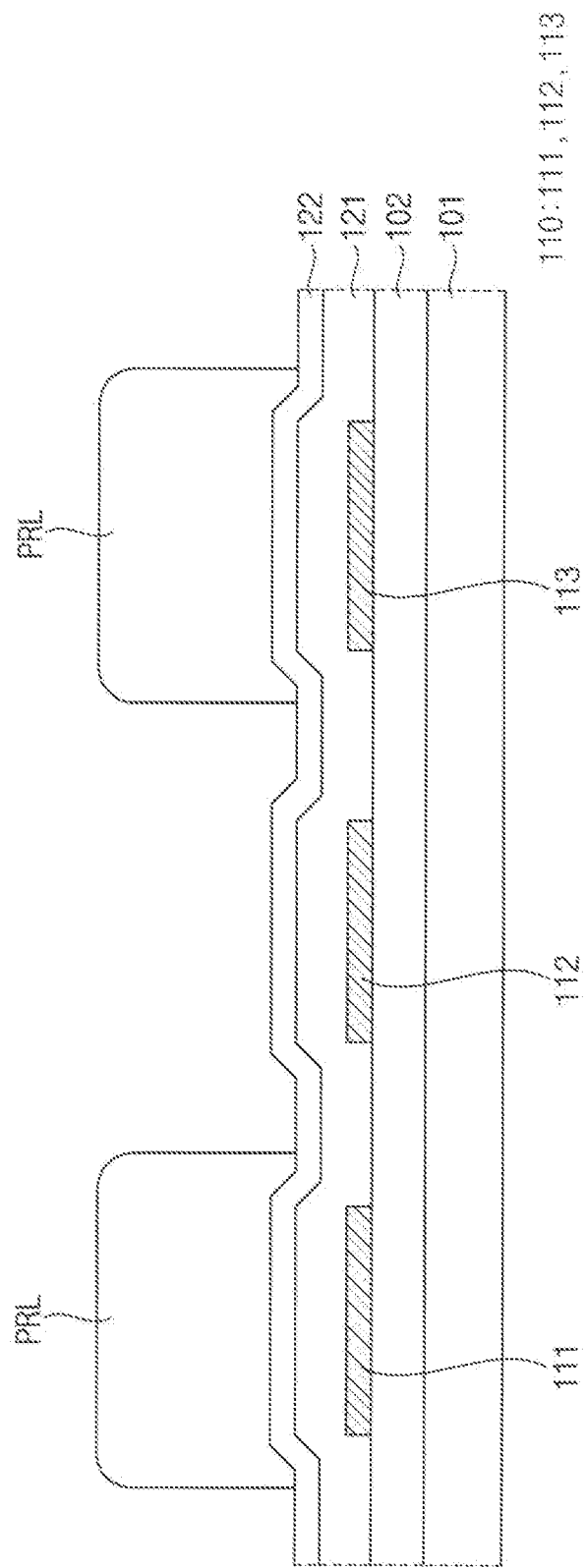

Referring to FIGS. 8, 9, and 10, a photoresist layer PRL may be formed on the second insulating layer 122. The photoresist layer PRL may overlap the first region 111 and the third region 113 of the active layer 110, and may not overlap the second region 112 of the active layer 110.

According to some embodiments, as illustrated in FIG. 8, the photoresist layer PRL may overlap only the first region 111 and the third region 113 of the active layer 110. In other words, the photoresist layer PRL may not overlap a remaining region of the active layer 110 outside the first region 111 and the third region 113 of the active layer 110.

According to some embodiments, as illustrated in FIG. 9, the photoresist layer PRL may overlap a remaining region of the active layer 110 outside the second region 112 of the active layer 110. According to some embodiments, the photoresist layer PRL may define a hole HL overlapping the second region 112 of the active layer 110.

Figure 11:
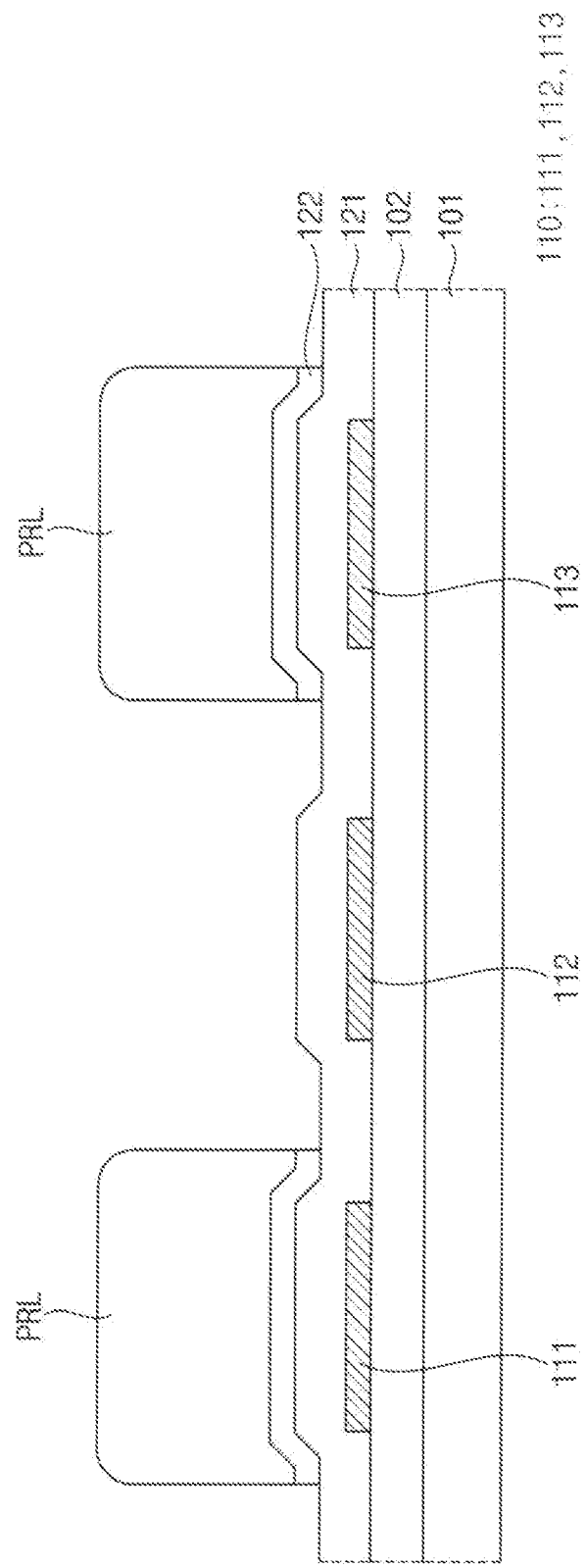

Referring to FIG. 11, a portion of the second insulating layer 122 overlapping the second region 112 of the active layer 110 may be etched using the photoresist layer PRL as an etch stopper. According to some embodiments, the second insulating layer 122 may be etched by a dry etching method. Because an etch selectivity of the first insulating layer 121 including silicon oxide and an etch selectivity of the second insulating layer 122 including one of silicon nitride and silicon oxynitride are different, the first insulating layer 121 may be partially etched or not be substantially etched in the process of etching the second insulating layer 122.

Figure 12:
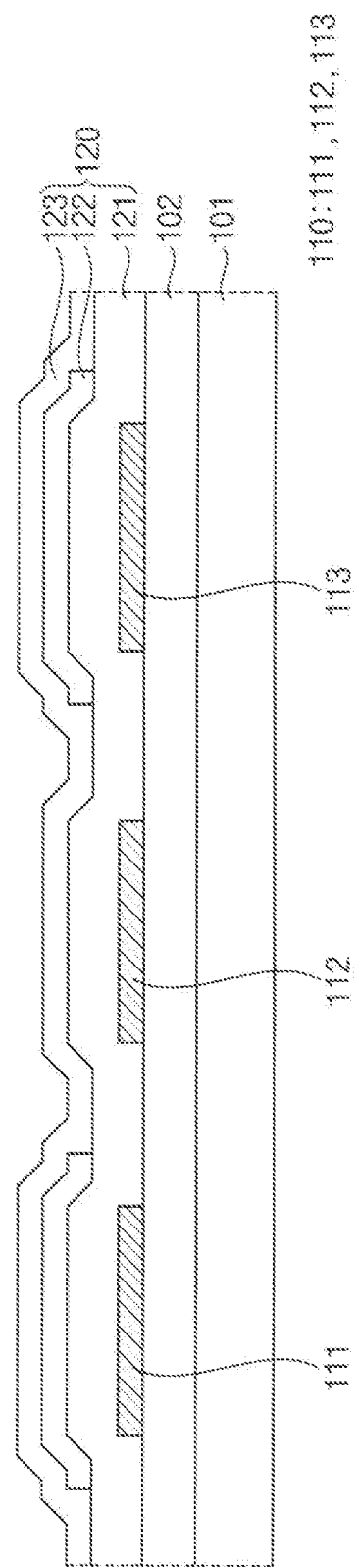

Referring to FIG. 12, the photoresist layer PRL may be removed, and the third insulating layer 123 may be formed on the second insulating layer 122. First, the photoresist layer PRL may be removed. Then, the third insulating layer 123 including silicon nitride may be formed on the second insulating layer 122.

Figure 13:
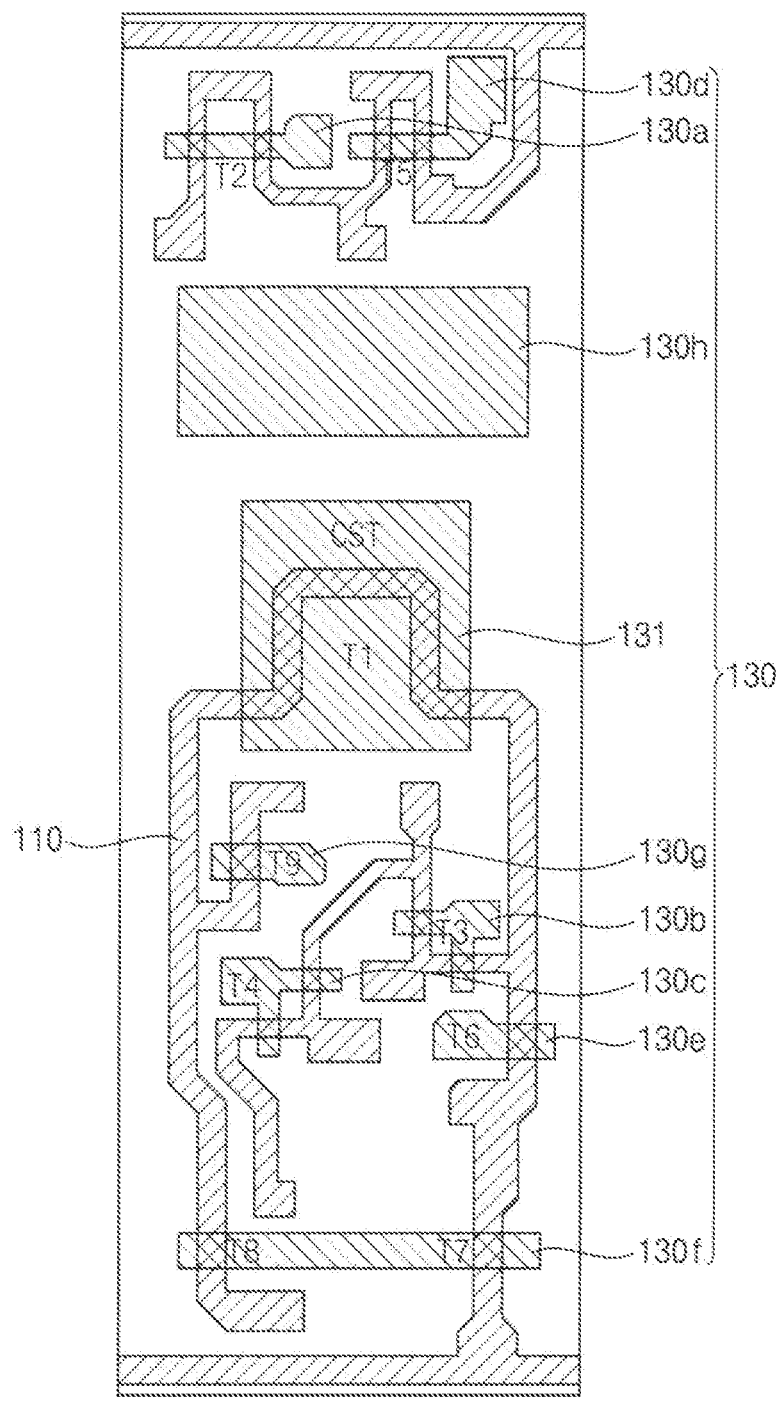
Figure 14:
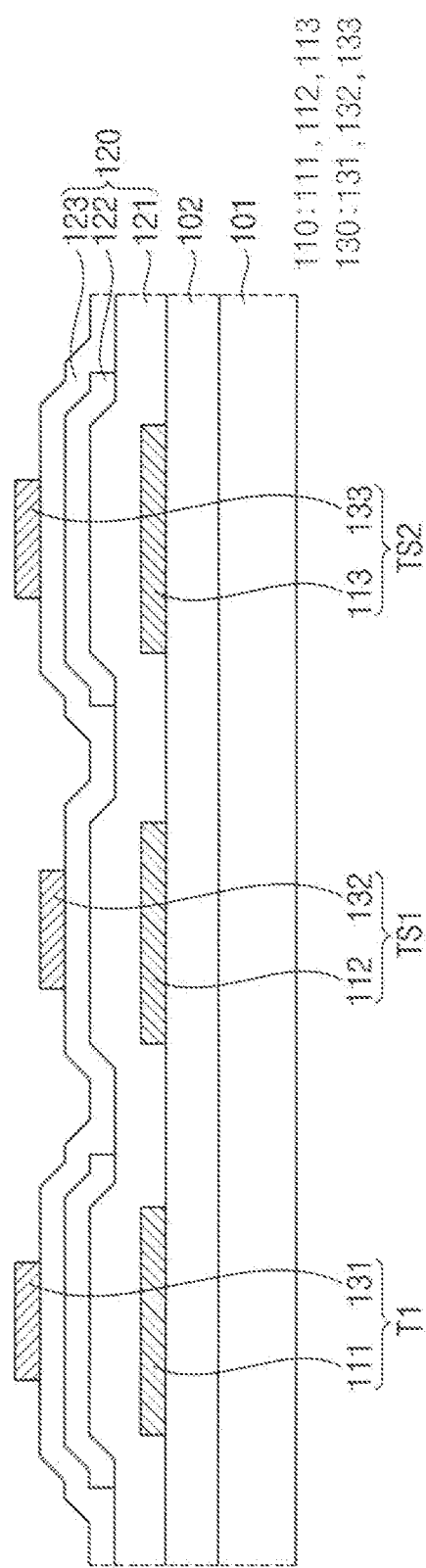

Referring to FIGS. 13 and 14, the first conductive layer 130 may be formed on the third insulating layer 123. A conductive material may be deposited on the third insulating layer 123 and patterned to form the first conductive layer 130.

Figure 15:
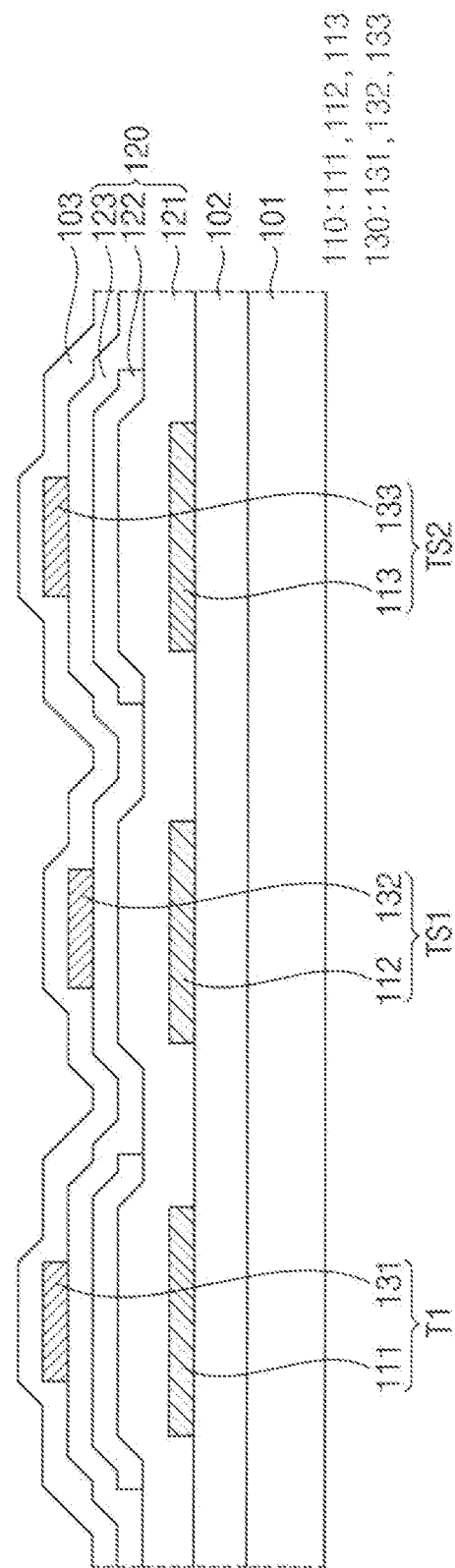

Referring to FIG. 15, the first insulating interlayer 103 may be formed on the first conductive layer 130.

Figure 16:
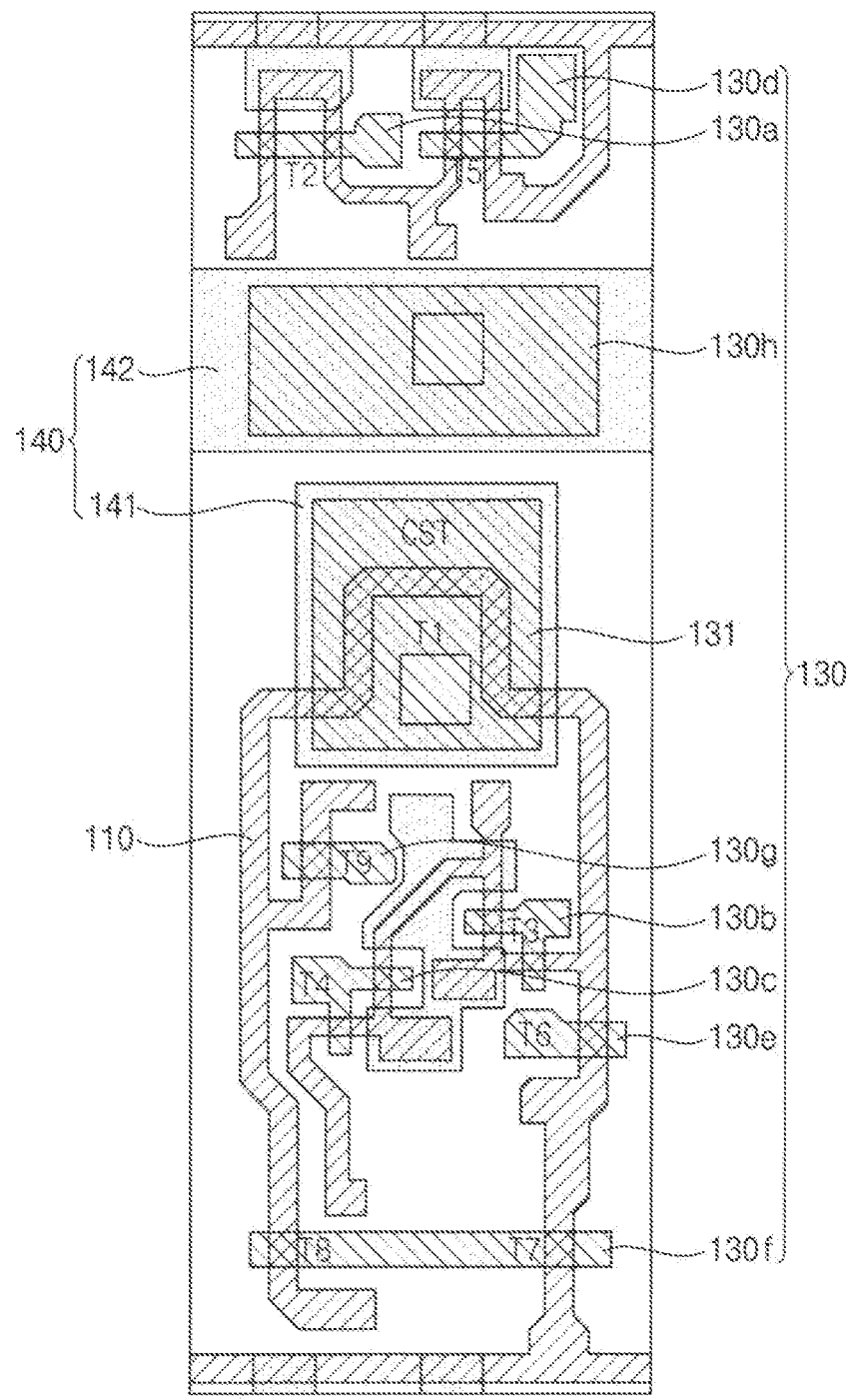
Figure 17:
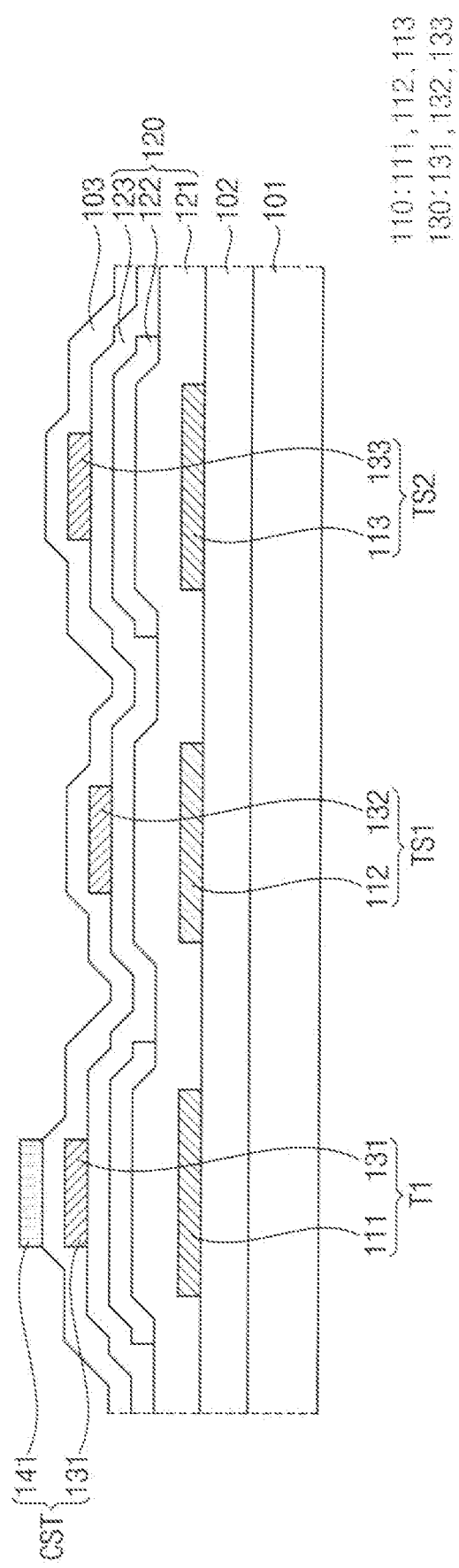

Referring to FIGS. 16 and 17, the second conductive layer 140 may be formed on the first insulating interlayer 103. A conductive material may be deposed on the first insulating interlayer 103 and patterned to form the second conductive layer 140.

Figure 18:
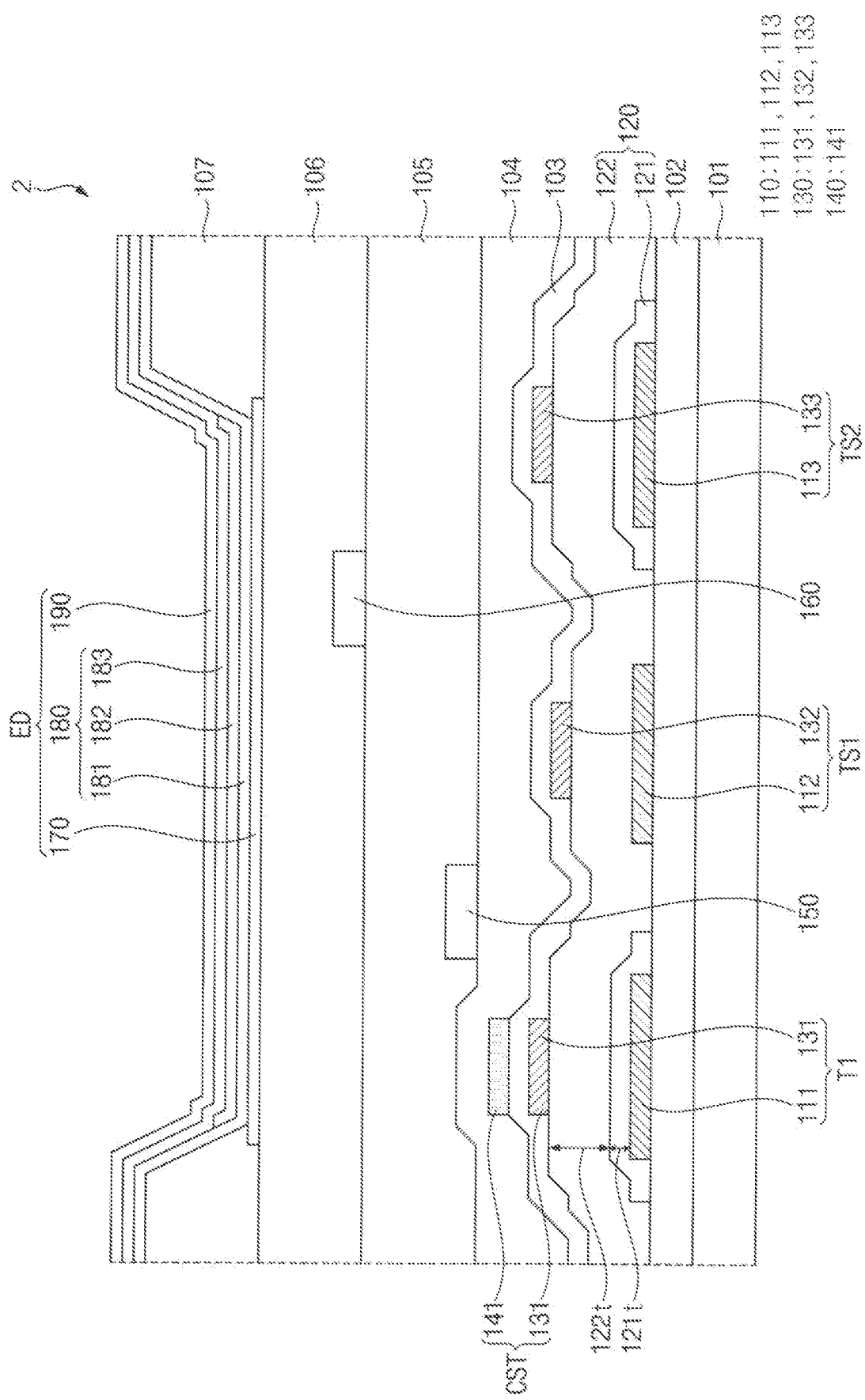
FIG. 18 is a cross-sectional view illustrating a display device according to some embodiments.

FIG. 18 is a cross-sectional view illustrating a display device 2 according to some embodiments.

Referring to FIG. 18, a display device 2 may include a substrate 101, a buffer layer 102, an active layer 110, a gate insulating layer 120, a first conductive layer 130, a first insulating interlayer 103, a second conductive layer 140, a second insulating interlayer 104, a third conductive layer 150, a first via insulating layer 105, a fourth conductive layer 160, a second via insulating layer 106, a first electrode 170, a pixel defining layer 107, an intermediate layer 180, and a second electrode 190. The display device 2 described with reference to FIG. 18 may be substantially the same as or similar to the display device 1 described with reference to FIGS. 3 and 4 except for the gate insulating layer 120. Accordingly, descriptions of the overlapping components will be omitted.

The gate insulating layer 120 may be located on the active layer 110. The gate insulating layer 120 may include a first insulating layer 121 and a second insulating layer 122.

The first insulating layer 121 may be located on the buffer layer 102, and may cover the active layer 110. The first insulating layer 121 may overlap the first region 111 and the third region 113 of the active layer 110, and may not overlap the second region 112 of the active layer 110. According to some embodiments, the first insulating layer 121 may overlap only the first region 111 and the third region 113 of the active layer 110. According to some embodiments, the first insulating layer 121 may overlap a remaining region of the active layer 110 outside the second region 112 of the active layer 110.

The first insulating layer 121 may include silicon oxide.

According to some embodiments, a thickness 121$t$ of the first insulating layer 121 may be about 200 Å to about 1000 Å.

The second insulating layer 122 may be located on the first insulating layer 121. The second insulating layer 122 may overlap the first region 111, the second region 112, and the third region 113 of the active layer 110. According to some embodiments, the second insulating layer 122 may be entirely located on the upper surface of the substrate 101.

The second insulating layer 122 may include silicon oxide. According to some embodiments, a thickness 122$t$ of the second insulating layer 122 may be about 800 Å to about 1400 Å.

A thickness of a first portion of the gate insulating layer 120 overlapping the first region 111 of the active layer 110 may be greater than a thickness of a second portion of the gate insulating layer 120 overlapping the second region 112 of the active layer 110. The thickness of the first portion of the gate insulating layer 120 may be the sum of the thickness 121$t$ of the first insulating layer 121 and the thickness 122$t$ of the second insulating layer 122, and the thickness of the second portion of the gate insulating layer 120 may be the thickness 123$t$ of the second insulating layer 122. A thickness of a third portion of the gate insulation layer 120 overlapping the third region 113 of the active layer 110 may be substantially equal to the thickness of the first portion of the gate insulation layer 120.

An equivalent oxide thickness of the first portion of the gate insulation layer 120 may be greater than an equivalent oxide thickness of the second portion of the gate insulation layer 120. According to some embodiments, when the thickness 121$t$ of the first insulating layer 121 including silicon oxide is 400 Å and the thickness 122$t$ of the second insulating layer 122 including silicon oxide is 1200 Å, the equivalent oxide thickness of the first portion of the gate insulation layer 120 may be about 1600 Å (=400 Å+1200 Å), and the equivalent oxide thickness of the second portion of the gate insulation layer 120 may be about 1200 Å.

Because the equivalent oxide thickness of the first portion of the gate insulating layer 120 is relatively large, the driving range of the driving transistor T1 may be relatively large. Further, because the equivalent oxide thickness of the second portion of the gate insulating layer 120 is relatively small, the leakage current of the first switching transistor TS1 may be relatively small.

FIGS. 19, 20, 21, 22, and 23 are diagrams illustrating a method of manufacturing a display device according to some embodiments. For example, FIGS. 19 to 23 may illustrate a method of manufacturing the display device 2 described with reference to FIG. 18. Descriptions of components of the method of manufacturing the display device described with reference to FIGS. 19 to 23, which are substantially the same as or similar to those of the method of manufacturing the display device described with reference to FIGS. 5 to 17, will be omitted.

Figure 19:
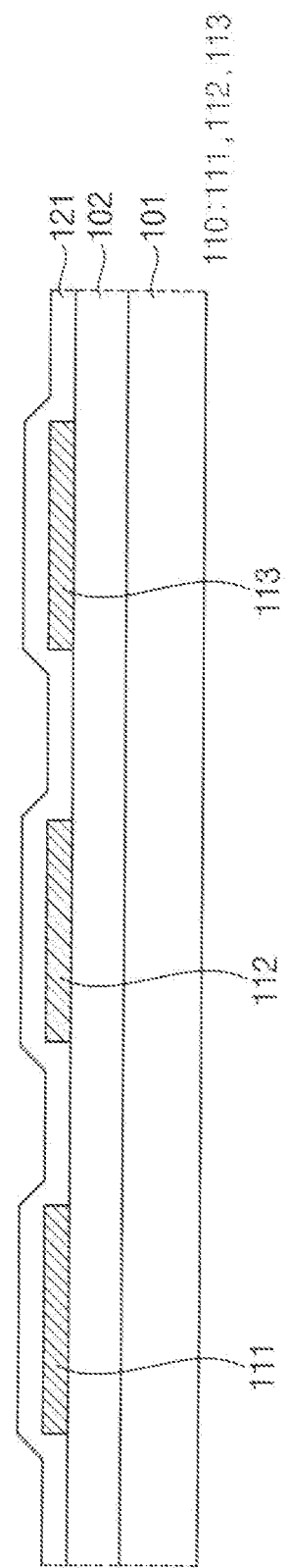
FIGS. 19, 20, 21, 22, and 23 are diagrams illustrating a method of manufacturing a display device according to some embodiments.

Referring to FIG. 19, the active layer 110 may be formed on the substrate 101, and the first insulating layer 121 may be formed on the active layer 110. First, the active layer 110 may be formed on the buffer layer 102. Then, the first insulating layer 121 including silicon oxide may be formed on the active layer 110.

Figure 20:
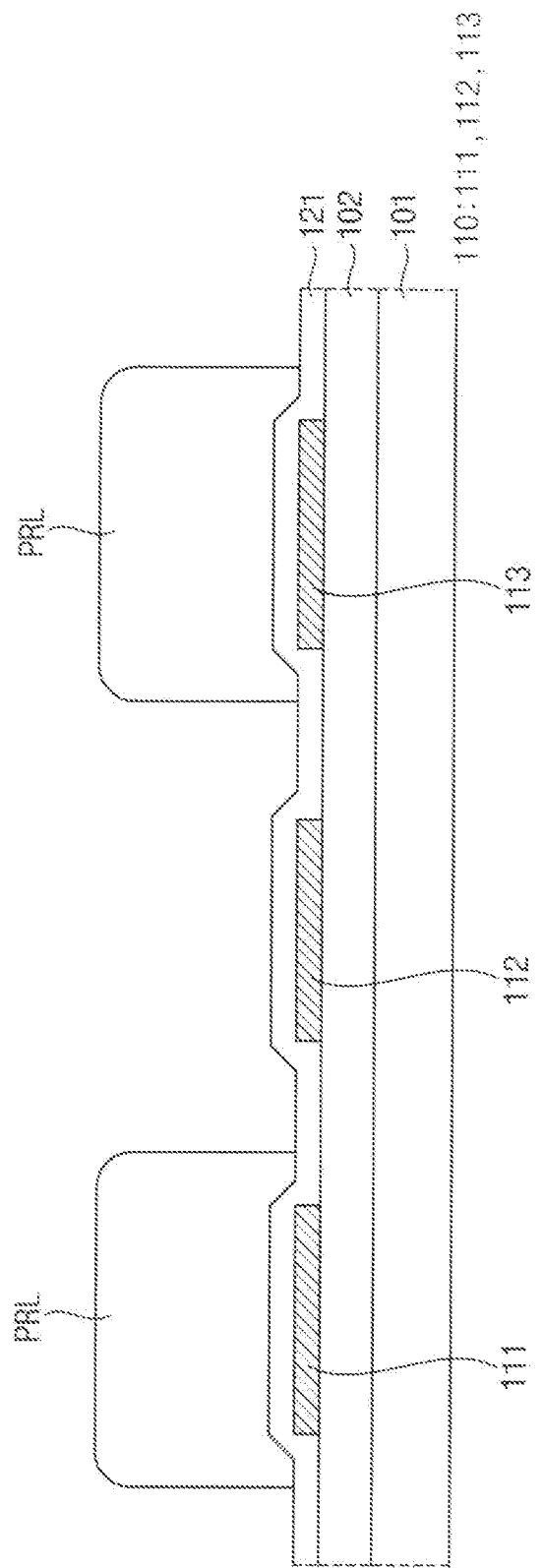

Referring to FIG. 20, a photoresist layer PRL may be formed on the first insulating layer 121. The photoresist layer PRL may overlap the first region 111 and the third region 113 of the active layer 110, and may not overlap the second region 112 of the active layer 110.

Figure 21:
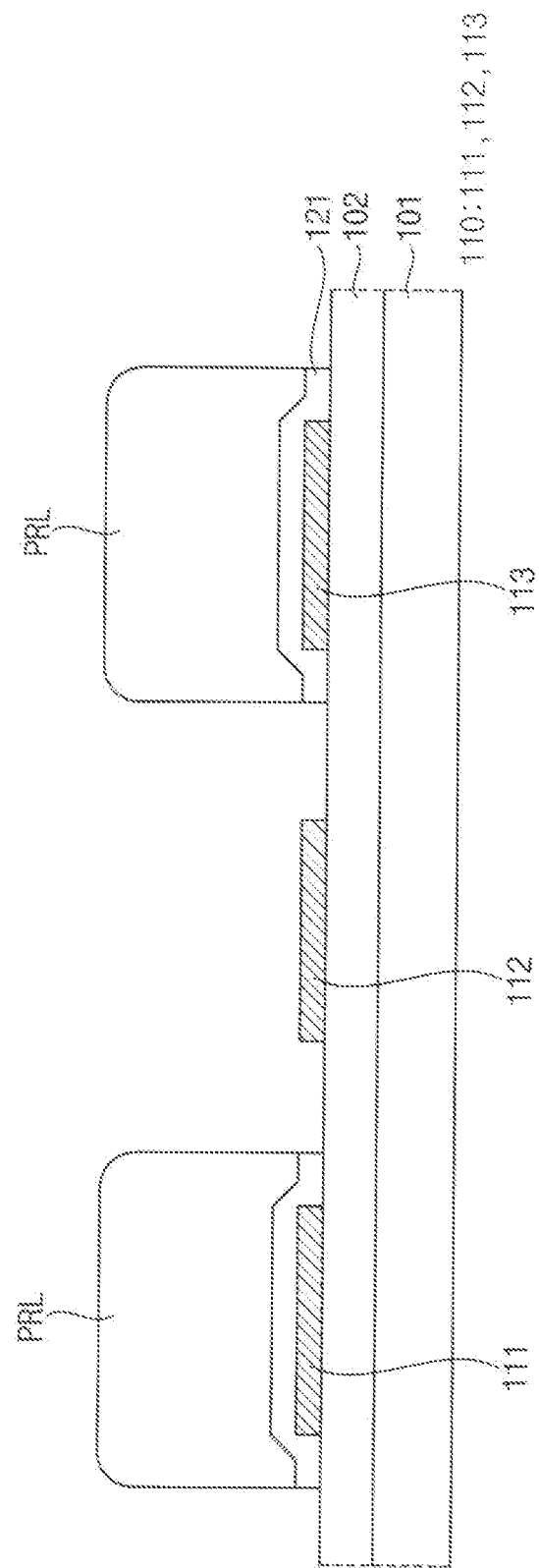

Referring to FIG. 21, a portion of the first insulating layer 121 overlapping the second region 112 of the active layer 110 may be etched using the photoresist layer PRL as an etch stopper. According to some embodiments, the first insulating layer 121 may be etched by a dry etching method. Because an etch selectivity of the active layer 110 and an etch selectivity of the first insulating layer 121 are different, the active layer 110 may be partially etched or may not be substantially etched in the process of etching the first insulating layer 121.

Figure 22:
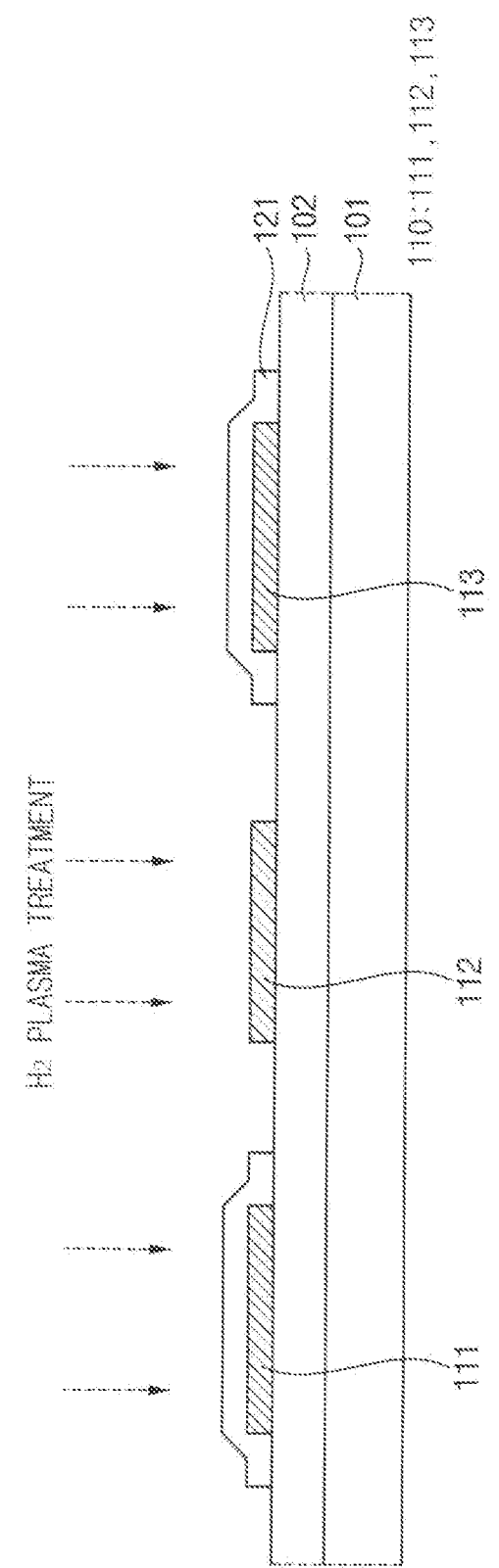

Referring to FIG. 22, the photoresist layer PRL may be removed, and the active layer 110 may be treated with hydrogen plasma. First, the photoresist layer PRL may be removed. Then, the active layer 110 may be treated with hydrogen plasma through the first insulating layer 121. The first insulating layer 121 may reduce or substantially block hydrogen from flowing into the active layer 110. Accordingly, the amount of hydrogen flowing into the first region 111 and the third region 113 of the active layer 110 may be less than the amount of hydrogen flowing into the second region 112 of the active layer 110.

Figure 23:
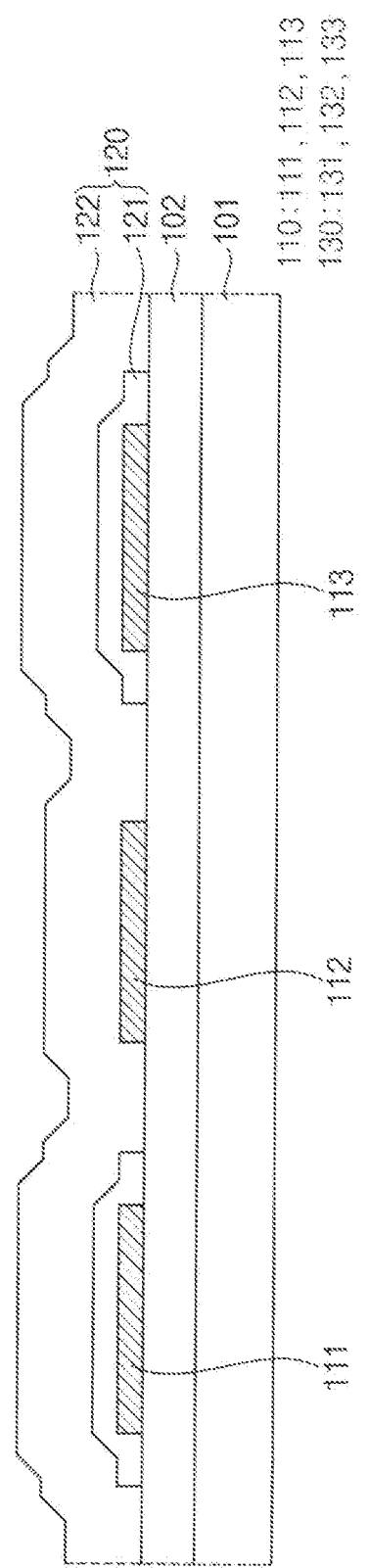

Referring to FIG. 23, the second insulating layer 122 may be formed on the first insulating layer 121. The second insulating layer 122 including silicon oxide may be formed on the buffer layer 102 to cover the first insulating layer 121.

Figure 24:
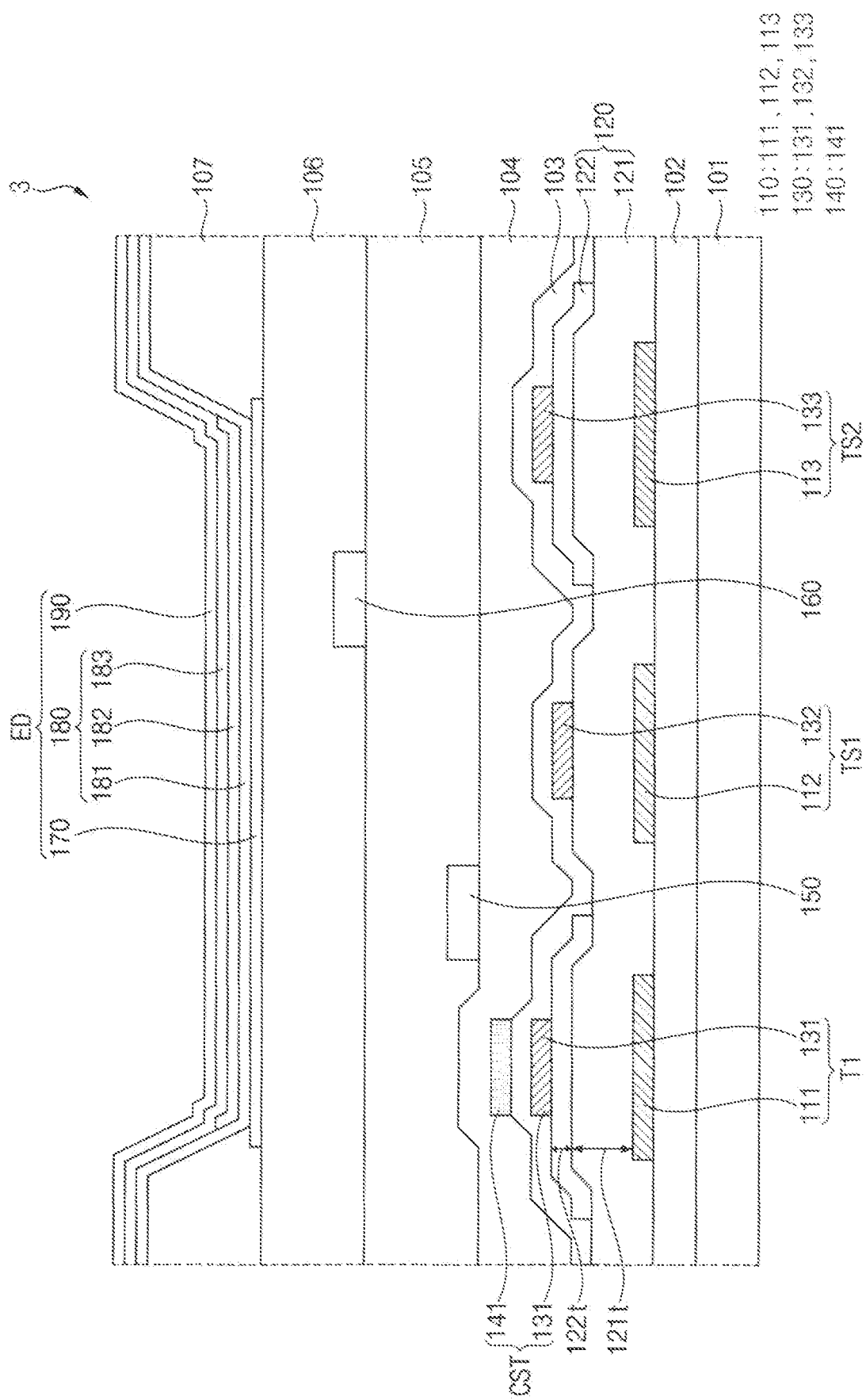
FIG. 24 is a cross-sectional view illustrating a display device according to some embodiments.

FIG. 24 is a cross-sectional view illustrating a display device 3 according to some embodiments.

Referring to FIG. 24, a display device 3 may include a substrate 101, a buffer layer 102, an active layer 110, a gate insulating layer 120, a first conductive layer 130, a first insulating interlayer 103, a second conductive layer 140, a second insulating interlayer 104, a third conductive layer 150, a first via insulating layer 105, a fourth conductive layer 160, and a second via insulating layer 106, a first electrode 170, a pixel defining layer 107, an intermediate layer 180, and a second electrode 190. The display device 3 described with reference to FIG. 24 may be substantially the same as or similar to the display device 1 described with reference to FIGS. 3 and 4 except for the gate insulating layer 120. Accordingly, descriptions of the overlapping components will be omitted.

The gate insulating layer 120 may be located on the active layer 110. The gate insulating layer 120 may include a first insulating layer 121 and a second insulating layer 122.

The first insulating layer 121 may be located on the buffer layer 102, and may cover the active layer 110. The first insulating layer 121 may overlap the first region 111, the second region 112, and the third region 113 of the active layer 110. According to some embodiments, the first insulating layer 121 may be entirely located on the upper surface of the substrate 101.

The first insulating layer 121 may include silicon oxide.

According to some embodiments, a thickness 121t of the first insulating layer 121 may be about 1200 Å to about 1400 Å.

The second insulating layer 122 may be located on the first insulating layer 121. The second insulating layer 122 may overlap the first region 111 and the third region 113 of the active layer 110, and may not overlap the second region 112 of the active layer 110. According to some embodiments, the second insulating layer 122 may overlap only the first region 111 and the third region 113 of the active layer 110. According to some embodiments, the second insulating layer 122 may overlap a remaining region of the active layer 110 outside the second region 112 of the active layer 110.

The second insulating layer 122 may include one of silicon nitride and silicon oxynitride. When the second insulating layer 122 includes silicon oxynitride, an atomic percentage of nitrogen in the second insulating layer 122 may be about 10% to about 50%.

According to some embodiments, a thickness 122t of the second insulating layer 122 may be about 200 Å to about 600 Å.

A thickness of a first portion of the gate insulating layer 120 overlapping the first region 111 of the active layer 110 may be greater than a thickness of a second portion of the gate insulating layer 120 overlapping the second region 112 of the active layer 110. The thickness of the first portion of the gate insulating layer 120 may be the sum of the thickness 121t of the first insulating layer 121 and the thickness 122t of the second insulating layer 122, and the thickness of the second portion of the gate insulating layer 120 may be the thickness 121t of the first insulating layer 121. A thickness of a third portion of the gate insulation layer 120 overlapping the third region 113 of the active layer 110 may be substantially equal to the thickness of the first portion of the gate insulation layer 120.

An equivalent oxide thickness of the first portion of the gate insulation layer 120 may be greater than an equivalent oxide thickness of the second portion of the gate insulation layer 120.

According to some embodiments, when the thickness 121t of the first insulating layer 121 including silicon oxide is 1200 Å and the thickness 122t of the second insulating layer 122 including silicon nitride is 400 Å, the equivalent oxide thickness of the first portion of the gate insulation layer 120 may be about 1433 Å (=1200 Å+(4.2/7.2)×400 Å), and the equivalent oxide thickness of the second portion of the gate insulation layer 120 may be about 1200 Å.

According to some embodiments, when the thickness 121t of the first insulating layer 121 including silicon oxide is 1200 Å and the thickness 122t of the second insulating layer 122 including silicon oxynitride in which an atomic percentage of nitrogen is 30% is 300 Å, the equivalent oxide thickness of the first portion of the gate insulating layer 120 may be about 1463 Å (=1200 Å+(4.2/4.8)×300 Å), and the equivalent oxide thickness of the second portion of the gate insulating layer 120 may be about 1200 Å.

Because the equivalent oxide thickness of the first portion of the gate insulating layer 120 is relatively large, the driving range of the driving transistor T1 may be relatively large. Further, because the equivalent oxide thickness of the second portion of the gate insulating layer 120 is relatively small, the leakage current of the first switching transistor TS1 may be relatively small.

FIGS. 25, 26, 27, and 28 are diagrams illustrating a method of manufacturing a display device according to some embodiments. For example, FIGS. 25 to 28 may illustrate a method of manufacturing the display device 3 described with reference to FIG. 24. Descriptions of components of the method of manufacturing the display device described with reference to FIGS. 25 to 28, which are substantially the same as or similar to those of the method of manufacturing the display device described with reference to FIGS. 5 to 17, will be omitted.

Figure 25:
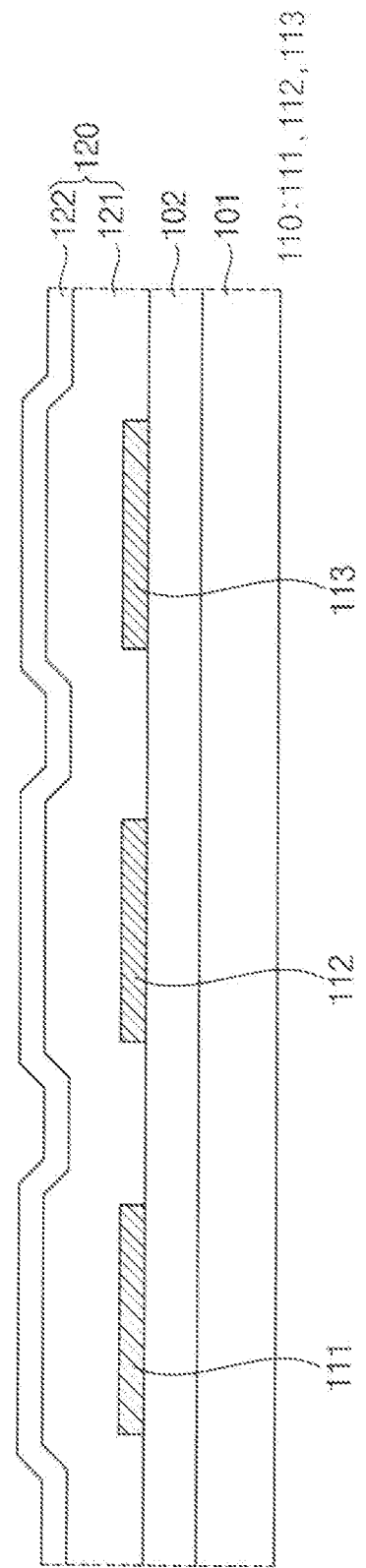
FIGS. 25, 26, 27, and 28 are diagrams illustrating a method of manufacturing a display device according to some embodiments.

Referring to FIG. 25, the first insulating layer 121 and the second insulating layer 122 may be sequentially formed on the active layer 110. First, the first insulating layer 121 including silicon oxide may be formed on the active layer 110. Then, the second insulating layer 122 including one of silicon nitride and silicon oxynitride may be formed on the first insulating layer 121.

Figure 26:
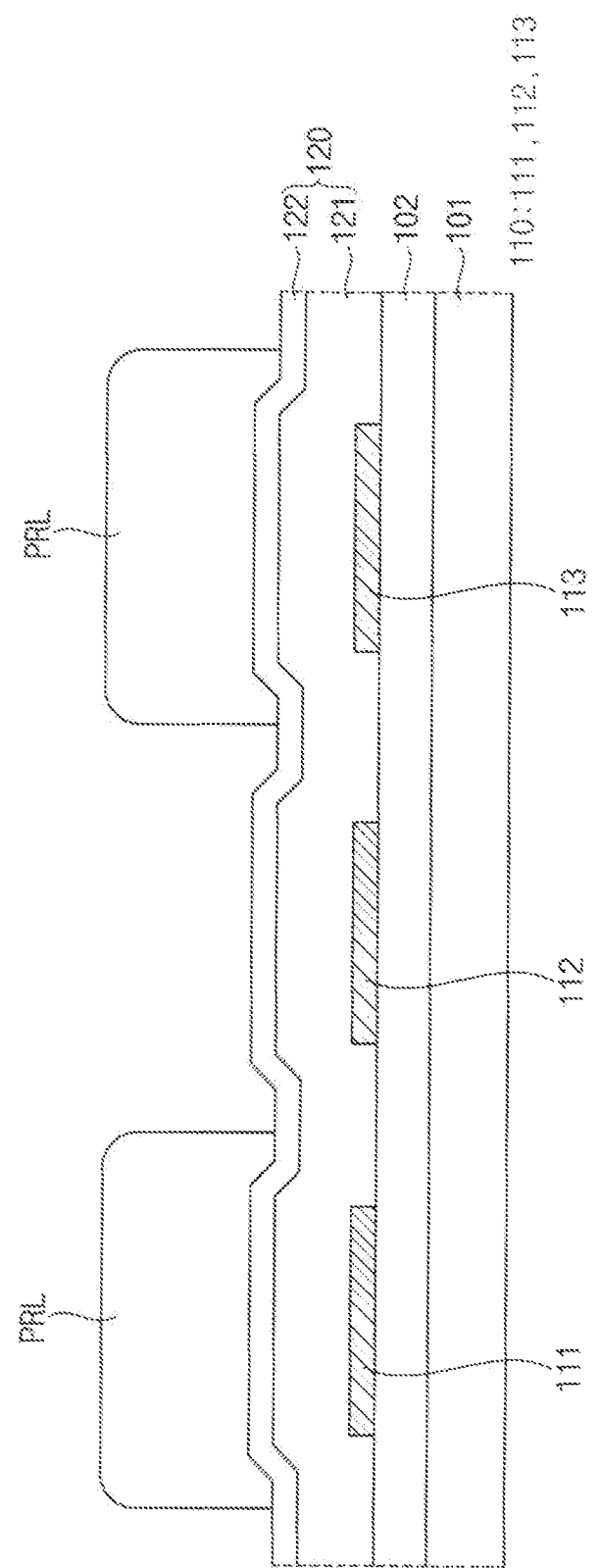

Referring to FIG. 26, a photoresist layer PRL may be formed on the second insulating layer 122. The photoresist layer PRL may overlap the first region 111 and the third region 113 of the active layer 110, and may not overlap the second region 112 of the active layer 110.

Figure 27:
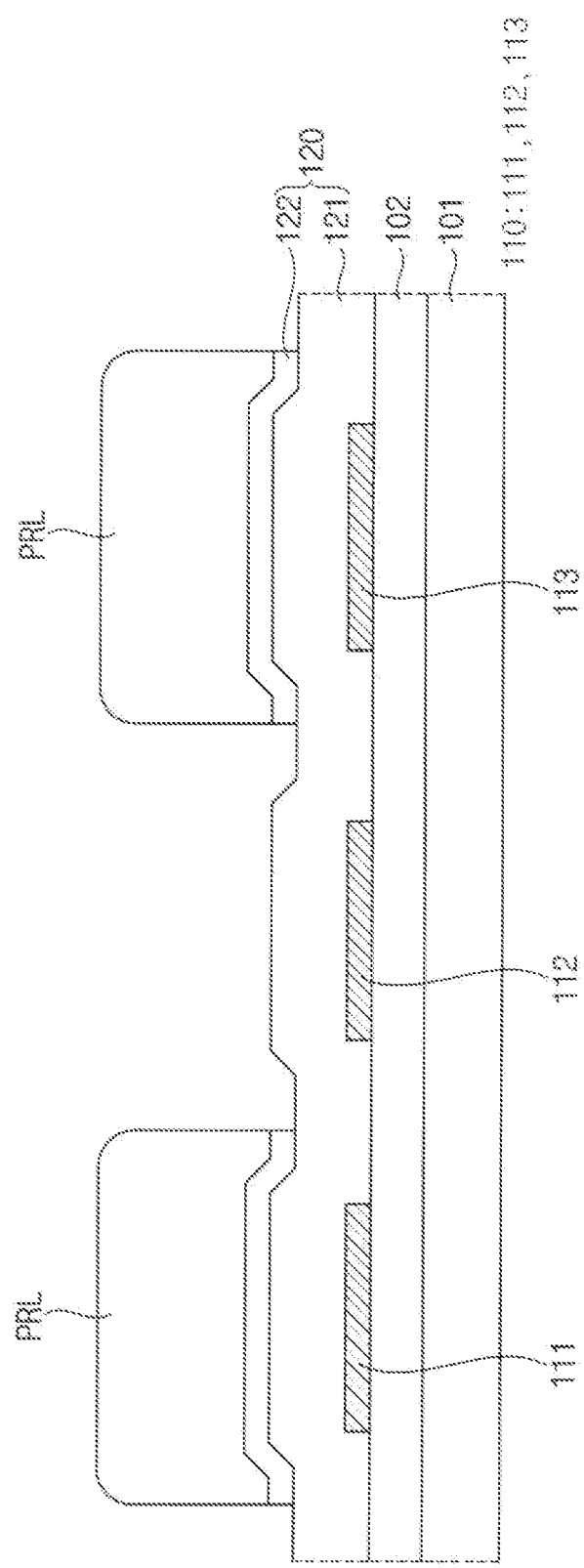

Referring to FIG. 27, a portion of the second insulating layer 122 overlapping the second region 112 of the active layer 110 may be etched using the photoresist layer PRL as an etch stopper. According to some embodiments, the second insulating layer 122 may be etched by a dry etching method. Because an etch selectivity of the first insulating layer 121 including silicon oxide and an etch selectivity of the second insulating layer 122 including one of silicon nitride and silicon oxynitride are different, the first insulating layer 121 may be partially etched or may not be substantially etched in the process of etching the second insulating layer 122.

Figure 28:
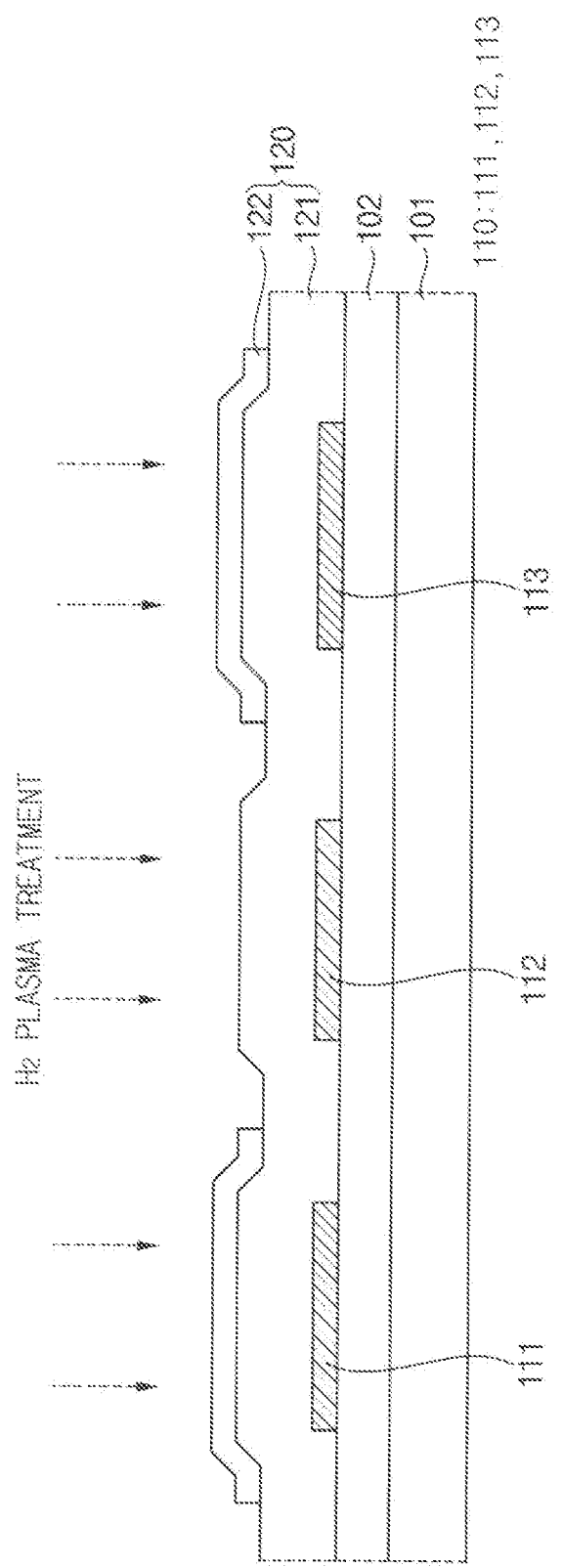

Referring to FIG. 28, the photoresist layer PRL may be removed, and the active layer 110 may be treated with hydrogen plasma. First, the photoresist layer PRL may be removed. Then, the active layer 110 may be treated with hydrogen plasma through the first insulating layer 121 and the second insulating layer 122. The second insulating layer 122 may reduce or substantially block hydrogen from flowing into the active layer 110. Accordingly, the amount of hydrogen flowing into the first region 111 and the third region 113 of the active layer 110 may be less than the amount of hydrogen flowing into the second region 112 of the active layer 110.

Figure 29:
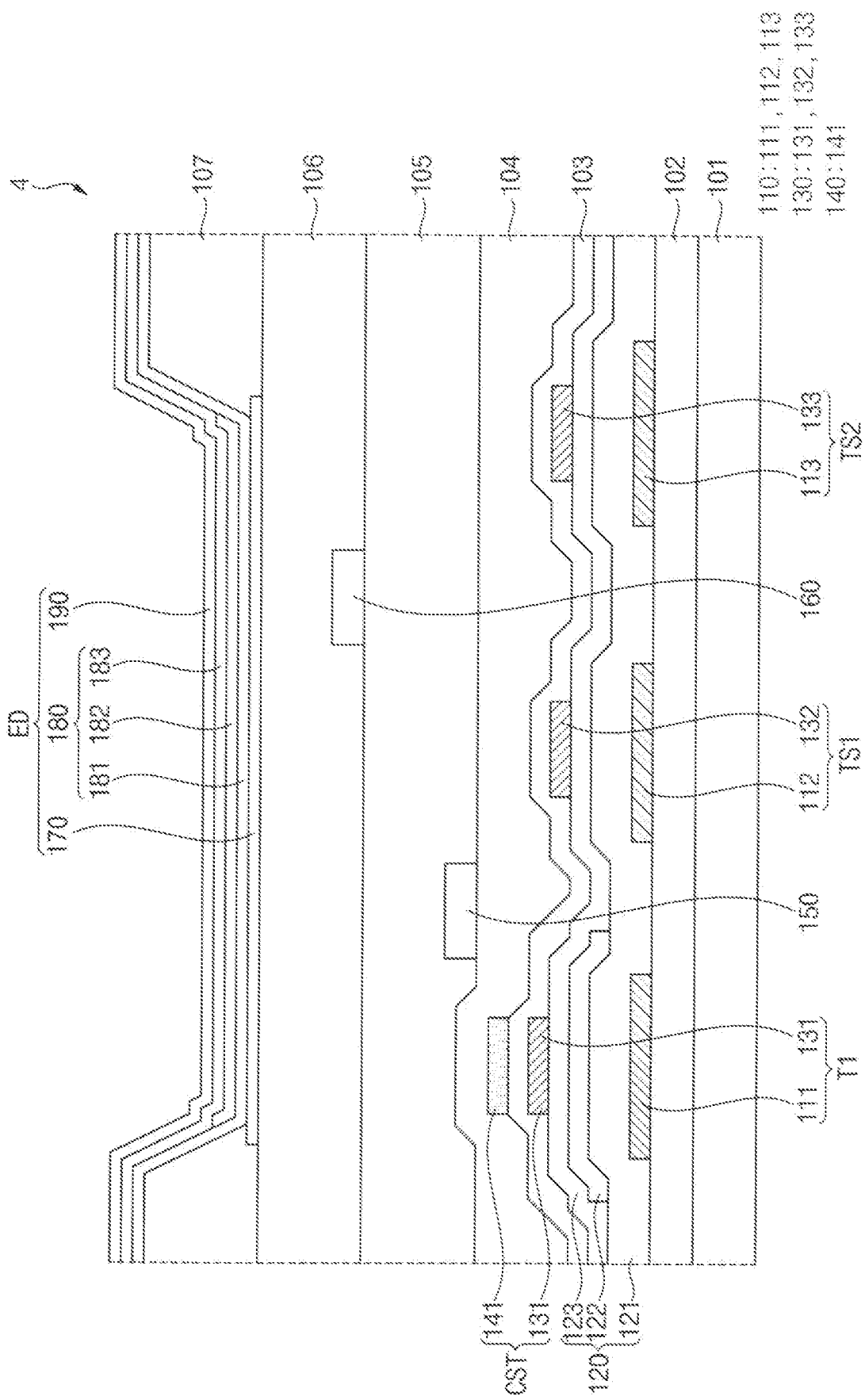
FIG. 29 is a cross-sectional view illustrating a display device according to some embodiments.

FIG. 29 is a cross-sectional view illustrating a display device 4 according to some embodiments.

Referring to FIG. 29, a display device 4 may include a substrate 101, a buffer layer 102, an active layer 110, a gate insulating layer 120, a first conductive layer 130, a first insulating interlayer 103, a second conductive layer 140, a second insulating interlayer 104, a third conductive layer 150, a first via insulating layer 105, a fourth conductive layer 160, a second via insulating layer 106, a first electrode 170, a pixel defining layer 107, an intermediate layer 180, and a second electrode 190. The display device 4 described with reference to FIG. 29 may be substantially the same as or similar to the display device 1 described with reference to FIG. 4 except for the active layer 110 and the gate insulating layer 120. Accordingly, descriptions of the overlapping components will be omitted.

The active layer 110 may include a first region 111, a second region 112, and a third region 113. A hydrogen concentration of the second region 112 may be greater than a hydrogen concentration in the first region 111. A hydrogen concentration of the third region 113 may be substantially equal to the hydrogen concentration of the second region 112.

The gate insulating layer 120 may be located on the active layer 110. The gate insulating layer 120 may include a first insulating layer 121, a second insulating layer 122, and a third insulating layer 123.

The second insulating layer 122 may be located on the first insulating layer 121. The second insulating layer 122 may overlap the first region 111 of the active layer 110, and may not overlap the second region 112 and the third region 113 of the active layer 110. According to some embodiments, the second insulating layer 122 may overlap only the first region 111 of the active layer 110. According to some embodiments, the second insulating layer 122 may overlap a remaining region of the active layer 110 outside the second region 112 and the third region 113 of the active layer 110.

A thickness of a first portion of the gate insulating layer 120 overlapping the first region 111 of the active layer 110 may be greater than a thickness of a second portion of the gate insulating layer 120 overlapping the second region 112 of the active layer 110. A thickness of a third portion of the gate insulating layer 120 overlapping the third region 113 of the active layer 110 may be substantially equal to the thickness of the second portion of the gate insulating layer 120.

Figure 30:
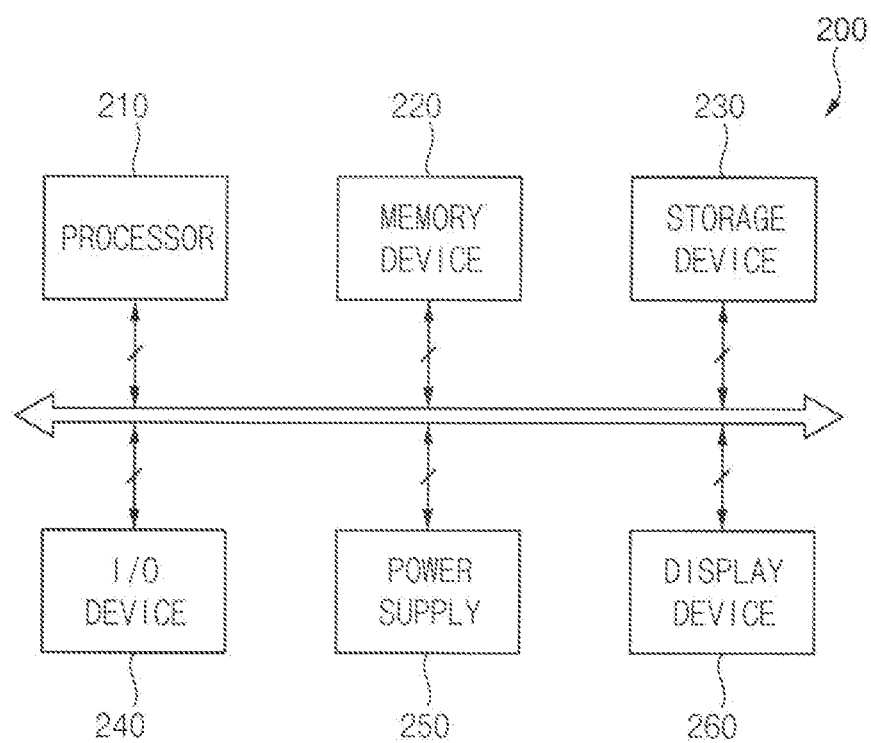
FIG. 30 is a block diagram illustrating an electronic apparatus according to some embodiments.
Figure 31:
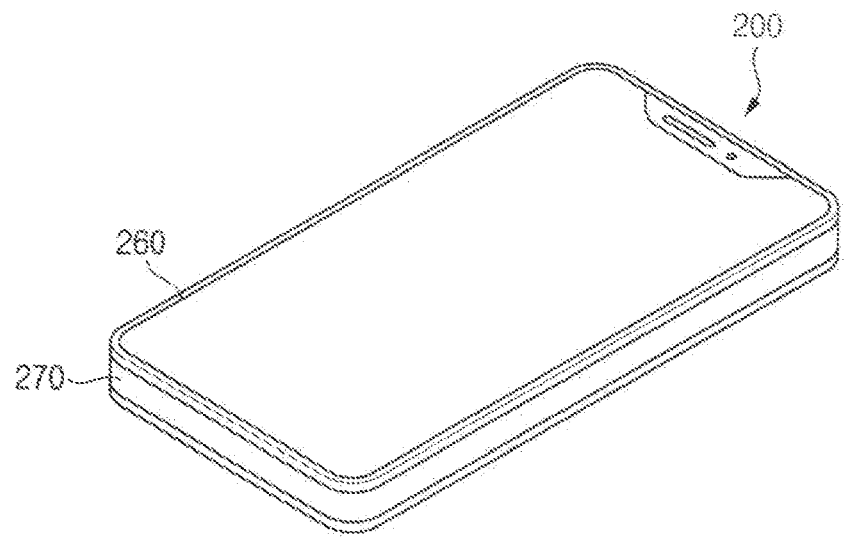
FIG. 31 is a diagram illustrating an example of the electronic apparatus in FIG. 30.

FIG. 30 is a block diagram illustrating an electronic apparatus 200 according to some embodiments. FIG. 31 is a diagram illustrating an example of the electronic apparatus 200 in FIG. 30, and FIG. 32 is a diagram illustrating an example of the electronic apparatus 200 in FIG. 30.

Figure 32:
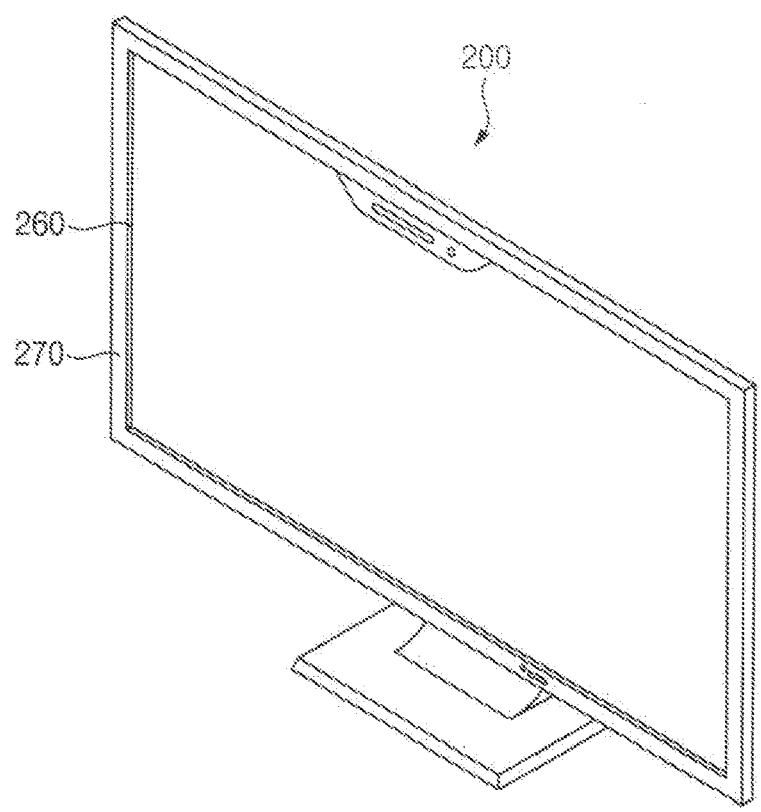
FIG. 32 is a diagram illustrating an example of the electronic apparatus in FIG. 30.

Referring to FIGS. 30, 31, and 32, an electronic apparatus 200 may include a processor 210, a memory device 220, a storage device 230, an input/output device 240, a power supply 250, a display device 260, and a case 270. The display device 260 may be any one of the display device 1 illustrated in FIGS. 1 and 4, the display device 2 illustrated in FIG. 18, the display device 3 illustrated in FIG. 24, and the display device 4 illustrated in FIG. 29. The electronic apparatus 200 may further include a plurality of ports for communicating with a video card, a sound card, a memory card, a universal serial bus ("USB") device, etc. or other systems. According to some embodiments, as illustrated in FIG. 31, the electronic apparatus 200 may be implemented as a smartphone. According to some embodiments, as illustrated in FIG. 32, the electronic apparatus 200 may be implemented as a monitor or a television. However, the present invention is not limited thereto, and the electronic apparatus 200 may also be implemented as a mobile phone, a video phone, a smart pad, a smart watch, a tablet PC, a vehicle navigation system, a laptop computer, a head mounted display ("HMD"), or the like.

The processor 210 may perform particular calculations or tasks. According to some embodiments, the processor 210 may be a microprocessor, a central processing unit ("CPU"), an application processor ("AP"), or the like. The processor 210 may be coupled to other components via an address bus, a control bus, a data bus, or the like. According to some embodiments, the processor 210 may be coupled to an extended bus such as a peripheral component interconnection ("PCI") bus.

The memory device 220 may store data for operations of the electronic apparatus 200. According to some embodiments, the memory device 220 may include a non-volatile memory device such as an erasable programmable read-only memory ("EPROM") device, an electrically erasable programmable read-only memory ("EEPROM") device, a flash memory device, a phase change random access memory ("PRAM") device, a resistance random access memory ("RRAM") device, a nano floating gate memory ("NFGM") device, a polymer random access memory ("PoRAM") device, a magnetic random access memory ("MRAM") device, a ferroelectric random access memory ("FRAM") device, etc., and/or a volatile memory device such as a dynamic random access memory ("DRAM") device, a static random access memory ("SRAM") device, a mobile DRAM device, etc.

The storage device 230 may include a solid state drive ("SSD") device, a hard disk drive ("HDD") device, a CD-ROM device, or the like. The I/O device 240 may include an input device such as a keyboard, a keypad, a touchpad, a touch-screen, a mouse device, etc., and an output device such as a speaker, a printer, etc. The power supply 250 may provide power for operations of the electronic apparatus 200.

The display device 260 may be coupled to other components via the buses or other communication links. According to some embodiments, the display device 260 may be included in the input/output device 240. As described above, in the display device 260, the equivalent oxide thickness of the gate insulating layer of the switching transistor may be less than the equivalent oxide thickness of the gate insulating layer of the driving transistor, or the hydrogen concentration of the active layer of the driving transistor may be less than the hydrogen concentration of the active layer of the switching transistor, so that the leakage current of the switching transistor may decrease, and the driving range of the driving transistor may increase.

The case 270 may accommodate components of the electronic apparatus 200 (e.g., the processor 210, the memory device 220, the storage device 230, the input/output device 240, the power supply 250, and the display device 260). The case 270 may include a material having a relatively high rigidity. For example, the case 270 may include a plurality of frames and/or plates formed of glass, plastic, metal, or the like. The case 270 may stably protect the components of the electronic apparatus 200 accommodated inside the case 270 from external impact.

The display device according to some embodiments may be applied to a display device included in a computer, a notebook, a mobile phone, a smart phone, a smart pad, a PMP, a PDA, an MP3 player, or the like.

Although the display devices the methods of manufacturing the display devices, and the electronic apparatuses according to some embodiments have been described with reference to the drawings, the illustrated embodiments are examples, and may be modified and changed by a person having ordinary knowledge in the relevant technical field without departing from the technical spirit described in the following claims.

What is claimed is:

1. A display device comprising:
a substrate; and
a plurality of pixel circuits on the substrate,
wherein at least one pixel circuit of the pixel circuits comprises:
an active layer including a first region and a second region;
a gate insulating layer on the active layer, the gate insulating layer including a first insulating layer overlapping the first region and the second region, a second insulating layer on the first insulating layer and overlapping the first region, and a third insulating layer on the second insulating layer and overlapping the first region and the second region; and
a first conductive layer on the gate insulating layer, the first conductive layer including a first gate electrode overlapping the first region to form a driving transistor, and a second gate electrode overlapping the second region to form a switching transistor, wherein a thickness of a first portion of the gate insulating layer overlapping the first region is greater than a thickness of a second portion of the gate insulating layer overlapping the second region.

2. The display device of claim 1, wherein an equivalent oxide thickness of the first portion of the gate insulating layer is greater than an equivalent oxide thickness of the second portion of the gate insulating layer.

3. The display device of claim 1, wherein a hydrogen concentration of the second region of the active layer is greater than a hydrogen concentration of the first region of the active layer.

4. The display device of claim 1, wherein the first insulating layer includes silicon oxide.

5. The display device of claim 1, wherein the third insulating layer includes silicon nitride.

6. The display device of claim 5, wherein the second insulating layer includes silicon nitride.

7. The display device of claim 6, wherein a hydrogen concentration of the second insulating layer is equal to a hydrogen concentration of the third insulating layer.

8. The display device of claim 6, wherein a hydrogen concentration of the second insulating layer is less than a hydrogen concentration of the third insulating layer.

9. The display device of claim 8, wherein a value [N—H]/[Si—H] (a ratio of a nitrogen-hydrogen bond concentration to a silicon-hydrogen bond concentration) of the second insulating layer is in a range from 14 to 30.

10. The display device of claim 5, wherein the second insulating layer includes silicon oxynitride.

11. The display device of claim 10, wherein an atomic percentage of nitrogen in the second insulating layer is in a range from 10% to 50%.

12. The display device of claim 1, wherein the at least one pixel circuit further comprises:
an insulating interlayer on the first conductive layer; and
a second conductive layer on the insulating interlayer, the second conductive layer including a capacitor electrode overlapping the first gate electrode to form a storage capacitor.

13. The display device of claim 12, wherein the second region of the active layer is electrically connected to the first gate electrode.

14. The display device of claim 12, wherein the second region of the active layer is electrically connected to the capacitor electrode.

15. A display device comprising:
a substrate; and
a plurality of pixel circuits on the substrate,
wherein at least one pixel circuit of the pixel circuits comprises:
an active layer including a first region having a first hydrogen concentration and a second region having a second hydrogen concentration greater than the first hydrogen concentration;
a gate insulating layer on the active layer, the gate insulating layer including a first insulating layer overlapping the first region and the second region, and a second insulating layer on the first insulating layer and overlapping the first region; and
a first conductive layer on the gate insulating layer, the first conductive layer including a first gate electrode overlapping the first region to form a driving transistor, and a second gate electrode overlapping the second region to form a switching transistor, wherein a thickness of a first portion of the gate insulating layer overlapping the first region is greater than a thickness of a second portion of the gate insulating layer overlapping the second region.

16. The display device of claim 15, wherein an equivalent oxide thickness of the first portion of the gate insulating layer is greater than an equivalent oxide thickness of the second portion of the gate insulating layer.

17. The display device of claim 15, wherein the first insulating layer includes silicon oxide.

18. The display device of claim 17,
wherein the second insulating layer includes silicon oxide.

19. The display device of claim 17, wherein the second insulating layer is on the first insulating layer, and
wherein the second insulating layer includes one of silicon nitride and silicon oxynitride.

20. An electronic apparatus comprising:
a display device configured to display an image; and
a case accommodating the display device,
wherein the display device comprises:
a substrate;
an active layer on the substrate, the active layer including a first region and a second region;
a gate insulating layer on the active layer, the gate insulating layer including a first insulating layer overlapping the first region and the second region, a second insulating layer on the first insulating layer and overlapping the first region, and a third insulating layer on the second insulating layer and overlapping the first region and the second region; and
a first conductive layer on the gate insulating layer, the first conductive layer including a first gate electrode overlapping the first region to form a driving transistor, and a second gate electrode overlapping the second region to form a switching transistor, and
wherein a thickness of a first portion of the gate insulating layer overlapping the first region is greater than a thickness of a second portion of the gate insulating layer overlapping the second region.

* * * * *